United States Patent
Ogura

(10) Patent No.: US 6,792,063 B1
(45) Date of Patent: Sep. 14, 2004

(54) FREQUENCY CONTROL/PHASE SYNCHRONIZING CIRCUIT

(75) Inventor: Youichi Ogura, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/601,796

(22) PCT Filed: Dec. 16, 1999

(86) PCT No.: PCT/JP99/07087

§ 371 (c)(1),
(2), (4) Date: Sep. 22, 2000

(87) PCT Pub. No.: WO00/36602

PCT Pub. Date: Jun. 22, 2000

(30) Foreign Application Priority Data

Dec. 17, 1998 (JP) .......................... 10-359578

(51) Int. Cl.[7] ................................................ H03D 3/24
(52) U.S. Cl. ...................... 375/375; 375/376; 370/516; 327/159; 327/160
(58) Field of Search ................................ 375/373, 375, 375/376; 327/141, 155, 156, 159, 160; 370/503, 516

(56) References Cited

U.S. PATENT DOCUMENTS

| | | | | |
|---|---|---|---|---|
| 5,677,802 A | * | 10/1997 | Saiki et al. | ..................... 360/51 |
| 5,995,465 A | * | 11/1999 | Hayashi et al. | .......... 369/47.28 |
| 6,560,053 B1 | * | 5/2003 | Ohta et al. | ..................... 360/51 |

FOREIGN PATENT DOCUMENTS

| | | |
|---|---|---|
| JP | 10-125010 | 5/1988 |
| JP | 63-249976 | 10/1988 |
| JP | 4-105435 | 4/1992 |
| JP | 7-65513 | 3/1995 |
| JP | 7-141781 | 6/1995 |
| JP | 8-124303 | 5/1996 |
| JP | 8-287623 | 11/1996 |

* cited by examiner

*Primary Examiner*—Stephen Chin
*Assistant Examiner*—Dac V. Ha
(74) *Attorney, Agent, or Firm*—Wenderoth, Lind & Ponack, L.L.P.

(57) ABSTRACT

The present invention has an object to perform phase synchronization pull-in at high speed and with good stability.

A predetermined frequency band of a reproduced signal is emphasized by a waveform equalization means 1. Its output signal is sampled by an A/D converter 2 using a reproduction clock. Low-band noises of a sampled signal are suppressed by a low-band noise suppression means 3. Then, cycle information is detected from a specific pattern length or pattern interval using a cycle detection means with high precision and high efficiency. The obtained cycle information is converted into a frequency error by a frequency error detector 9. On the other hand, a phase error is detected by a phase error detector 10 from the output of the low-band noise suppression means 3. The frequency error and the phase error are passed through loop filters and thereafter added, whereby an oscillator 15 which generates a reproduction clock is controlled.

16 Claims, 19 Drawing Sheets

Fig.14 (a) modulated signal (recorded data) 0 0 0 1 1 1 0 0 0 0 0 0 0 1 1 1 1 1 1 1 1 1 1 0 0 0 0 0 0 0 0 0 0 0 1 1 1 0 0 0 0 0 0

Fig.14 (b) reproduced signal

Fig.14 (c) binarized digital signal slice level

6T

11T synchronization pattern of DVD 18T synchronization pattern synchronization pattern at position A
on an inner track shown in figure 15 synchronization pattern at position B
on an outer track shown in figure 15 in the case where frequency of reproduction clock is in phase in the case where frequency of reproduction clock is twice as high as frequency at phase-locked time in a case where frequency of reproduction clock is half as high as frequency at phase-locked time in the case where frequency of reproduction clock is in phase in the case where frequency of reproduction clock is twice as high as frequency at phase-locked time in a case where frequency of reproduction clock is half as high as frequency at phase-locked time phase-unlocked time phase-locked time in the case where frequency of reproduction clock is in phase in the case where frequency of reproduction clock is twice as high as frequency at phase-locked time in the casa where frequency of reproduction clock is half as high as frequency at phase-locked time

FREQUENCY CONTROL/PHASE SYNCHRONIZING CIRCUIT

This application is a National Stage of International Application No. PCT/JP99/07087 Dec. 11, 1999.

TECHNICAL FIELD

The present invention relates to a frequency control and phase lock circuit. More particularly, it relates to a frequency control and phase lock circuit which is capable of high-speed and stable phase synchronization pull-in reproduction of a clock for reproducing a digital signal which is recorded on an optical disk medium, utilizing a linear velocity cycle detected from a reproduced signal, also in a situation where the linear velocity cycle of the reproduced signal varies.

BACKGROUND ART

As a method of recording digital data on an optical disk medium, a method in which the recording is performed at a constant linear velocity to equalize the recording density on the recording medium is used in many cases as can be seen in the case of CDs (Compact Disks) or DVDs. In a case where the phase synchronization pull-in is performed for an optical disk reproduced signal which was subjected to the mark-length modulation and digital modulation to obtain a constant linear recording density, when the difference between the frequency of the clock component of the reproduced signal and the frequency of the clock generated by a phase-locked loop circuit is large, there is a great risk of uncompleted phase synchronization pull-in or pseudo pull-in to a frequency which is different from that of the clock component of the reproduced signal. In order to avoid these situations, the reproduction linear velocity cycle is detected on the basis of the pulse length or pulse interval of a specific pulse included in the reproduced signal, and control of the rotational speed of the disc or control of the free-running frequency of the phase-locked loop is performed, whereby the normal phase synchronization pull-in can be realized.

For example, there is a disc reproduction system as shown in FIG. 12. Data as shown in FIG. 14(a) are recorded on an optical disk 47 so as to have a constant linear recording density. Assume that the recorded data are controlled to have 3 or more and 14 or less consecutive "0"s or "1"s, as in the 8–16 modulation system. The amplitude of a signal which is reproduced by a reproduction means 48 is attenuates in higher-band frequency components due to the interference, as the linear recording density of the recorded data increases. Thus, this signal is subjected to the compensation by a waveform equalization means 1 to emphasize the higher-band frequency components. The emphasized reproduced signal (FIG. 14(b)) is binarized at a predetermined slice level by a binarization means 49, to be converted into a binarized digital signal (FIG. 14(c)).

Then, a cycle detection means 50 counts the cycle of a specific pattern of the digital signal which was binarized by the binarization means 49, using a high-frequency clock. The high frequency clock which is used here is generated by an oscillator 51. In this case, the oscillator 51 is a crystal oscillator which stably oscillates at a fixed frequency, or the like. As shown in FIG. 13, the cycle detection means 50 consists of a counter means 52 continuously counting a pulse width or pulse interval of a specific pulse which is counted using the high-frequency clock, a holding means 53 holding a count result which is just previously obtained by the counter means 52, an addition means 54 receiving a result which is output by the counter means 52 and the data which are held and output by the holding means 53, and adding the two consecutive counted pulse width or pulse interval results, and a judgement means 55 obtaining the maximum value or minimum value of the outputs of the addition means 54 at every predetermined period. The cycle detection means 50 obtains the maximum value or minimum value of the sum of the two consecutive pulse widths (or pulse intervals). The information obtained by the cycle detection means 50 is inversely proportional to the linear velocity and includes cycle information of the clock of the reproduced signal. Therefore, the control is performed on the basis of this information so that the free-running frequency of the phase-locked loop circuit 56 nearly matches the frequency of the clock component of the reproduced signal. In this case, a phase-locked loop circuit 56 consists of a phase comparator 57, a charge pump 58, a loop filter 59 and a VCO. 60. This VCO 60 adaptively operates the center frequency on the basis of the frequency information obtained by the cycle detection means 50, and performs the control so that the oscillated frequency almost matches the frequency of the clock component of the digital signal which is obtained by the binarization means 49. Thereby, the phase synchronization pull-in can be completed without waiting until the rotation of a motor is settled near the stationary rotation at a timing of starting the reproduction of the disc or immediately after the seek at the CLV reproduction time when the reproduction is performed at a constant linear velocity.

For example in the CAV reproduction in which data are reproduced with fixing the rotation speed of the motor for rotating the recording medium, the linear velocity of the reproduced data varies according to whether an accessed area is on an inner track or outer track of the disc. Assume that the frequency which is synchronized with that of the reproduced data is 20 MHz at an inner track position A and 40 MHz at an outer track position B as shown in FIG. 15, and the high-frequency clock which is output by the oscillator 51 is at 100 MHz. In this case, when a DVD is reproduced, the reproduced signal has a synchronization pattern consisting of contiguous 14T and 4T as shown in FIG. 16(a) at regular periods. Here, T is a period corresponding to 1 bit of a recording code included in the reproduced signal. When the pattern length of this synchronization pattern is counted using a 100-MHz high frequency clock, a detected count value is (14+4)×100/20=90 at the inner track position A as shown in FIG. 16(b) and (14+4)×100/40=45 at the outer track position B as shown in FIG. 16(c). Therefore, it is understood that the count value obtained using the high-frequency clock is information which is inversely proportional to the linear velocity at the reproduction position. Utilizing this principle, assuming that the data at the outer track position B are sought in a state where the data at the inner track position A are being reproduced, the reproduction clock which is output by the VCO 60 is at 20 MHz just after the seeking, which is the phase-locked frequency at the inner track position A, as shown in FIG. 17. However, when the synchronization pattern is counted using the 100-MHz high-frequency clock and the obtained count number is 45, the feedback is performed so that the reproduction clock output by the VCO 60 approaches 40 MHz according to estimates from the cycle information. The processing is performed up to the area where the phase synchronization pull-in can be performed. Then, the phases of the reproduced data and reproduction clock can be synchronized by the phase-locked loop circuit 56.

However, when the high-frequency clock is used in the above-described means for detecting the cycle from the reproduced signal, the oscillator for generating the high-frequency clock is required. In addition, when the reproduction is to be performed at higher speed with an increased rotation of the motor, it is required to calculate the cycle according to the reproduction speed. On the other hand, in order to simplify the cycle calculation, it is required to change the oscillated frequency of the high-frequency clock in proportion to the rotational speed of the motor. Further, in order to improve the precision of the cycle detection means, it is desirable to utilize the pattern length and pattern interval of synchronization patterns which are included in the recorded data at regular intervals. However, in the case where the detection of the pattern length and pattern interval of the synchronization patterns is used for detecting the cycle from the reproduced signal, when the deviation between the frequency of the clock component of the reproduced signal and the frequency of the clock generated by the phase-locked loop circuit is large, the precision in detection of the synchronization patterns in detecting the frequency deviation or the like should be regarded as important. Accordingly, the time for specifying the synchronization pattern is increased, whereby the efficiency in detection of the synchronization pattern, which is required in high-speed frequency pull-in, is decreased. Further, the phase of the high-frequency clock used in the cycle detection means is not synchronized with the phase of the frequency of the clock component of the reproduced data, and thereby the detection results vary. Thus, particularly when the linear velocity of the reproduced data continuously varies during the reproduction period after phase locking, the detection precision is deteriorated.

The present invention is made to solve these problems of the prior art. It is an object of the present invention to provide a frequency control and phase lock circuit, by constructing the means for detecting the linear velocity cycle information from a reproduced signal so as to detect cycle information and phase information from multi-bit reproduced digital data which are obtained by the sampling using a reproduction clock which is used instead of the high-frequency clock, performing the control so as to synchronize the phase of the reproduction clock with the phase of the clock component of the reproduced digital data on the basis of this information, and thereby unifying the clock into one system, whereby the high-speed and stable phase synchronization pull-in can be realized using the reproduction clock also in a state where the linear velocity of reproduced digital data varies.

DISCLOSURE OF THE INVENTION

A frequency control and phase lock circuit according to the present invention comprises: waveform equalization means for emphasizing a predetermined frequency band of a reproduced signal; an A/D converter for sampling a signal equalized by the waveform equalization means to obtain multi-bit digital data using a reproduction clock to be used when the equalized signal is reproduced as digital data; low-band noise suppression means for suppressing low-band noises in the signal obtained by the sampling on the basis of the reproduction clock; a zero cross length detector for detecting a position where the signal crosses a zero level, the low-band noises of which signal are suppressed, counting a number of samples between adjacent zero crosses on the basis of the reproduction clock, and holding the number of samples in a register; a frame counter for counting a specific period of at least one frame; a maximum pattern length detector and a minimum pattern length detector for detecting a maximum value and a minimum value of count values of zero cross lengths in the specific period counted by the frame counter or sums of count values of adjacent zero cross lengths, respectively; a cycle information judgement unit for comparing the maximum pattern length with the minimum pattern length, and selecting an optimal value as cycle information using a ratio between the maximum and minimum pattern lengths; a frequency error detector having both of means for converting a difference between the cycle information which is selected by the cycle information judgement unit and the maximum or minimum pattern length which is to be detected at a phase-locked time, into a frequency error and outputting the frequency error, and means for judging a synchronization pattern from the maximum pattern length, converting an interval between the synchronization patterns into a frequency error and outputting the frequency error; a frequency control circuit for performing control as far as an area where the reproduction clock can be synchronized with the reproduced digital signal on the basis of an output of the frequency error detector; a phase error detector for detecting phase information from the signal, the low-band noises of which signal are suppressed; a phase control circuit for performing phase control so that reproduction clock is in phase with the reproduced digital signal on the basis of an output of the phase error detector; and an oscillator for adding an output of the frequency control circuit and an output of the phase control circuit, and oscillating a reproduction clock on the basis of the sum, thereby enabling phase synchronization pull-in at a time of reproduction of the digital data, whereby the above-mentioned problems are solved.

According to the present invention, the reproduction clock is used in place of the high-frequency clock, the cycle information and the phase information is detected from multi-bit reproduced digital data which are obtained by the sampling on the basis of the reproduction clock, and the control is performed so as to synchronize the phase of the reproduction clock with the phase of the clock component of the reproduced digital data, whereby the clock can be unified into one system. Therefore, the high-speed and stable phase synchronization pull-in can be realized using the reproduction clock, also in a state where the linear velocity of the reproduced digital data varies.

A frequency control and phase lock circuit according to on embodiment of the present invention comprises: waveform equalization means for emphasizing a predetermined frequency band of a reproduced signal; an A/D converter for sampling an equalized signal to obtain multi-bit digital data using a reproduction clock to be used when the equalized signal is reproduced as digital data; low-band noise suppression means for suppressing low-band noises in the signal obtained by the sampling; a zero cross length detector for detecting a position where the signal crosses a zero level, the low-band noises of which signal are suppressed, counting a number of samples between adjacent zero crosses, and holding the number of samples in a register; a frame counter for counting a specific period of at least one frame; a maximum pattern length detector and a minimum pattern length detector for detecting a maximum value and a minimum value of count values of zero cross lengths in the counted specific period or sums of count values of adjacent zero cross lengths, respectively; a cycle information judgement unit for comparing the maximum pattern length with the minimum pattern length, and selecting an optimal value of the pattern length as cycle information using a ratio between the maximum and minimum pattern lengths; a frequency error detector for converting a difference between the cycle information which is selected by the cycle information judgement unit and the maximum or minimum pattern length which is to be detected at a phase-locked time, into a frequency error, and outputting the frequency error; a frequency control circuit for performing control as far as an area where the reproduction clock can be synchronized with the reproduced digital signal on the basis of an output of the frequency error detector; a phase error detector for detecting phase information from the signal, the low-band noises of which signal are suppressed; a phase control circuit for performing phase control so that reproduction clock is in phase with the reproduced digital signal on the basis of an output of the phase error detector; and an oscillator for adding an output of the frequency control circuit and an output of the phase control circuit, and oscillating a reproduction clock on the basis of the sum, and the frequency control and phase lock circuit enables phase synchronization pull-in at a time of reproduction of the digital data.

Therefore, the high-frequency clock for detecting the cycle and the oscillator for the high-frequency clock can be dispensed with. Accordingly, not only the circuit construction can be simplified, but also the stable phase synchronization pull-in can be realized also in a state where the linear velocity of the reproduced digital data varies, because the reproduced digital data and the frequency error information can be generated using one clock. In addition, an optimal one of the maximum pattern length and the minimum pattern length is selected and utilized as the frequency error. Therefore, not only the frequency pull-in of the reproduction clock can be performed at high speed, but also the frequency control can be performed also at the seeking time when the cycle detection is regarded as difficult.

According to another embodiment of the present invention, in the frequency control and phase lock circuit of the above-discussed embodiment, the maximum pattern length detector has a synchronization pattern judgement unit for judging whether a pattern is a synchronization pattern based on a ratio between adjacent zero cross lengths, and updates the maximum pattern length only when the judgement unit judges that the pattern is the synchronization pattern and has a value larger than a held value, and the minimum pattern length detector has a minimum inversion pattern judgement unit for judging whether a pattern is a minimum inversion pattern based on a ration between the adjacent zero cross lengths, and updates the minimum pattern length only when the judgement unit judges that the pattern is the minimum inversion pattern and has a value smaller than a held value.

Therefore, the pattern can be detected with high precision also in the case where the deviation between the frequency of the reproduction clock and the frequency of the clock component of the reproduced digital data is large. Accordingly, the precision in the cycle detection is increased, whereby the frequency pull-in of the reproduction clock can be performed stably.

According to another embodiment of the present invention, in the frequency control and phase lock circuit of an above-discussed embodiment, the cycle information judgement unit comprises: registers for holding the maximum pattern length and the minimum pattern length which are obtained within the specific period counted by the frame counter, at a termination of the period, respectively; and means for automatically setting a period which is to be counted next by the frame counter, based on the pattern length which is obtained as a result of the comparison by the cycle information judgement unit between the values which are held respectively by the registers, the obtained pattern length being regarded as optimal as the cycle information.

Therefore, the detection period for detecting one synchronization pattern included in one frame can be automatically decided based on the frequency information, whereby the efficiency in detecting the synchronization pattern is improved and the frequency pull-in of the reproduction clock can be performed at high speed.

According to another embodiment of the present invention, in the frequency control and phase lock circuit of an above-discussed embodiment, the frequency error detector comprises: synchronization pattern position detection means for detecting a position of a synchronization pattern, using the sum of the adjacent zero cross lengths detected by the zero cross length detector, the judgement result output by the synchronization pattern judgement unit, and the maximum pattern length held by the register; and means for detecting an interval between the synchronization patterns on the basis of a result of the detection, converting the value of the interval into frequency error information, and outputting the frequency error information, and the frequency control and phase lock circuit has a function of switching the precision in detecting the synchronization pattern position by the synchronization pattern position detection means according to deviation between a frequency of the reproduction clock of the synchronization pattern and a frequency of a clock component of the reproduced digital data detected by the frequency error detector.

Therefore, the appropriate synchronization pattern position can be detected according to the amount of deviation between the frequency of the reproduction clock and the frequency of the clock component of the reproduced digital data. Accordingly, not only the precision in detection of the synchronization pattern interval is increased, but also the resolution of the cycle information is increased with respect to the case where the pattern length is detected. Therefore, the cycle can be detected with high precision, whereby the frequency of the reproduction clock can be pulled in stably as far as an area where the reproduction clock can be in phase with the reproduced digital data.

According to anther embodiment of the present invention, in the frequency control and phase lock circuit of an above-discussed embodiment, the frequency error detector has a counter for counting a period during which no synchronization pattern is detected, based on the reproduction clock, and when a count value of the counter is larger than a predetermined value, a mode control circuit for deciding a control state of the frequency control and phase lock circuit sets again plural mode signals output by the mode control circuit in a specific state.

Therefore, the abnormal state is judged by calculating the period during which the synchronization pattern is not detected, and when the state is judged as abnormal, the self-restoration operation is performed. Accordingly, the restoration time at the abnormal operation can be reduced.

According to another embodiment of the present invention, the frequency control and phase lock circuit of an above-discussed embodiment comprises: a frequency error converter for converting the frequency error information output by the frequency error detector, which information is obtained by converting the interval between the synchronization patterns, into phase error information, and outputting the phase error information, and in the frequency control and phase lock circuit, the phase control circuit is operated based on the output phase error information, and the reproduction clock is pulled-in with high precision as far as a frequency area where the phase locking can be performed.

Therefore, the phase control circuit is operated based on the cycle information which is detected by the frequency control circuit, and the frequency of the reproduction clock can be brought closer to the frequency of the clock component of the reproduced digital data by the resolution of the frequency which can be controlled by the frequency control circuit or more. Accordingly, even when the capture range as the phase pull-in range of the phase-locked loop is narrow, the stable phase synchronization pull-in can be realized.

According to another embodiment of the present invention, the frequency control and phase lock circuit of an above-discussed embodiment comprises: both of the functions of the frequency error detector of one of the above-discussed embodiments and the frequency error detector of another of the above-discussed embodiments, and in the frequency control and phase lock circuit, the frequency of the reproduction clock is controlled based on the pattern length of the specific pattern in an area where the deviation between the frequency of the reproduction clock and the frequency of the clock component of the reproduced digital data is larger, and the frequency of the reproduction clock is controlled based on the interval between the synchronization patterns in an area where the deviation is smaller, the deviation in the frequency between the reproduction clock and the clock component of the reproduced digital data is obtained, and the control state is switched continuously and automatically using the plural mode signals which are output by the mode control circuit for deciding the control state of the frequency control and phase lock circuit, thereby pulling-in the frequency of the reproduction clock.

Therefore, in the area where the deviation between the frequency of the reproduction clock and the frequency of the clock component of the reproduced digital signal is larger, the pattern length of the specific pattern can be more easily detected than the synchronization pattern interval. In the area where the deviation in the frequency is smaller, the synchronization pattern interval can be detected with higher precision. Therefore, the frequency pull-in and the phase synchronization pull-in can be performed at high speed and with good stability by the control utilizing the respective advantages.

According to another embodiment of the present invention, the frequency control and phase lock circuit of an above-discussed embodiment comprises: phase control range detection means for detecting that one of the plural mode signals for deciding the control state, which are output by the mode control circuit, indicates that the reproduction clock is in phase with the reproduced digital signal and the phase control circuit operates outside a control range of predetermined values, and outputting a flag, and in the frequency control and phase lock circuit, the operation of the frequency control circuit is controlled so that the operation of the phase control circuit comes within the predetermined range, when the flag output by the phase control range detection means is detected.

Therefore, even when the linear velocity of the reproduced data varies after the phase synchronization pull-in, the phase locked state can be maintained stably.

BRIEF DESCRIPTION OF THE DRAWINGS

FIGS. 14(a), 14(b) and 14(c) are diagram showing recorded data and waveforms in the prior art optical disk reproduction device.

BEST MODE FOR CARRYING OUT THE INVENTION

Hereinafter, embodiments of the present invention will be described with reference to FIGS. 1 to 11, 15 and 18 to 22.

Embodiment 1

A frequency control and phase lock circuit according to a first embodiment of the present invention will be described with reference to the block diagram of FIG. 1.

Figure 1:
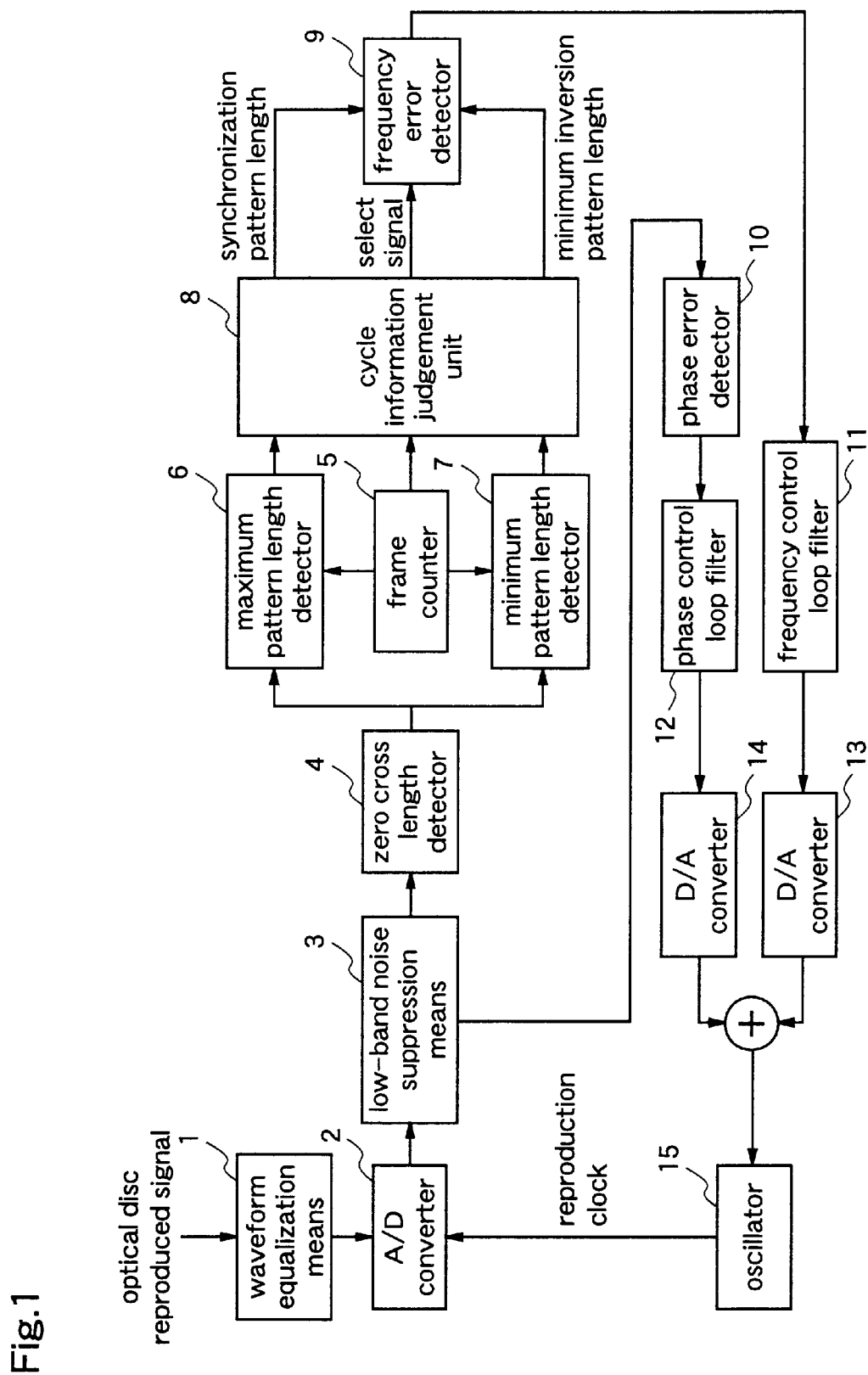
FIG. 1 is a block diagram illustrating a structure of a frequency control and phase lock circuit according to a first embodiment of the present invention.

In FIG. 1, numeral 1 denotes a waveform equalization means for subjecting an optical disk reproduced signal to compensation so as to emphasize a high frequency band. This means 1 is constituted by a filter which can arbitrarily set the boost amount and the cutoff frequency. For example, the means 1 is a high-order ripple filter or the like. Numeral 2 denotes an A/D converter for converting an analog signal into a digital signal using a reproduction clock which is used when an output signal of the waveform equalization means 1 is reproduced in digital data. The A/D converter 2 samples the analog signal to obtain a multi-bit digital signal. Numeral 3 denotes a low-band noise suppression means for suppressing low-band noise components included in the obtained multi-bit reproduced digital signal. The low-band noise suppression means 3 consists of a means for detecting a DC component of the reproduced digital signal and a means for subtracting the detected DC component from the reproduced digital signal. Numeral 4 denotes a zero cross length detector for continuously detecting the position where the reproduced digital signal whose low-band noise components are suppressed crosses the zero level, counting the number of samples between the adjacent zero crosses on the basis of the reproduction clock, and holding the number of samples in a register as a zero cross length. Numeral 5 denotes a frame counter for counting a specific period of one or more frames based on the reproduction clock, using the output of the zero cross length detector 4. Numeral 6 denotes a maximum pattern length detector for detecting the maximum value of the sum of count values of adjacent zero cross lengths in the period which is set by the frame counter 5, and holding the maximum value as the maximum pattern length in a register. Numeral 7 denotes a minimum pattern length detector for detecting the minimum value of the sum of the count values of the adjacent zero cross lengths in the period which is set by the frame counter 5, and holding the minimum value in a register as the minimum pattern length. Numeral 8 denotes a cycle information judgement unit for comparing the cycle information obtained by the maximum pattern length detector 6 with the cycle information obtained by the minimum pattern length detector 7, selecting an optimal value as the cycle information utilizing a ratio between the both information, and outputting a select signal. Numeral 9 denotes a frequency error detector for converting the difference between the cycle information which is selected based on the select signal and the maximum or minimum pattern length which is to be detected at the phase-locked time, into a frequency error, and outputting the error. Numeral 10 denotes a phase error detector for detecting phase information of reproduced digital data using an output which is obtained by the low-band noise suppression means 3. Numeral 11 denotes a frequency control loop filter for performing the frequency control as far as an area where the reproduction clock can be synchronized with the reproduced digital signal, using the amount of the frequency error which is output by the frequency error detector 9. Numeral 12 denotes a phase control loop filter for performing the phase control using an output of the phase error detector 10 so that the reproduction clock is synchronized with the reproduced digital signal. Numerals 13 and 14 each denote a D/A converter for converting a digital signal into an analog electric signal and outputting the electric signal. Numeral 15 denotes an oscillator for adding the analog electric signals which are respectively obtained by the D/A converters 13 and 14, and generating a reproduction clock based on of an electric signal obtained by the addition.

Next, the operation of the so-constructed frequency control and phase lock circuit according to the first embodiment is described.

An output signal, which is obtained by subjecting an optical disk reproduced signal to the compensation by the waveform equalization means 1 so as to emphasize the high frequency band, is output to the A/D converter 2. The A/D converter 2 converts the output signal, which is obtained by subjecting the optical disk reproduced signal to the compensation, into a multi-bit reproduced digital signal using a reproduction clock generated by the oscillator 15, by the sampling. The signal which is obtained by the sampling by the A/D converter 2 is in phase with the reproduction clock. Thereafter, all processing for data, such as the counting, is performed based on this reproduction clock. The multi-bit reproduction digital signal which is obtained by the sampling is input to the low-band noise suppression means 3, and the low-band noise components included in the reproduced digital signal are suppressed. The reproduced digital signal whose low-band noise components are suppressed is input to the zero cross length detector 4. The zero cross length detector 4 continuously detects the position where the signal crosses the zero level, counts the number of samples between the adjacent zero crosses based on the reproduction clock, and holds the count value in the register as the zero cross length. Further, with utilizing the output of the zero cross length detector 4, the maximum pattern length detector 6 and the minimum pattern length detector 7 respectively detect the maximum value and minimum value of the sum of the count values of the adjacent zero cross lengths in the period set by the frame counter 5 which counts the specific period of one or more frames based on the reproduction clock, hold the maximum value and minimum value in the register, and obtain information which is inversely proportional to the liner velocity cycle of the reproduced digital data.

In the cycle information judgement unit 8, the cycle information, which are obtained by the maximum pattern length detector 6 and the minimum pattern length, detector 7, i.e., the maximum pattern length and the minimum pattern length are compared with each other. Then, the optimal value is selected as the cycle information utilizing the ratio between the both pattern lengths, and the select signal indicating the optimal value is output to the frequency error detector 9. The frequency error detector 9 converts the difference between the cycle information selected in accordance with the select signal, and the maximum or minimum pattern length which is to be detected at a phase-locked time, into the frequency error, and decides the amount of the frequency error for performing the frequency control of the reproduction clock. The phase information of the reproduced digital data is detected by the phase error detector 10 utilizing the output which is obtained by the low-band noise suppression means 3, and the amount of the phase error for performing the phase locking control between the reproduction clock and the reproduced digital data is decided.

The frequency error amount, which is decided by the frequency error detector 9, is input to the frequency control loop filter 11. The frequency control loop filter 11 performs the frequency control as far as the area where the reproduction clock can be synchronized with the reproduced digital signal using the frequency error amount, and inputs an output digital signal into the D/A converter 13. The D/A converter 13 converts the input digital signal into an analog electric signal and outputs the signal. The phase error amount which is decided by the phase error detector 10 is input to the phase control loop filter 12. The phase control loop filter 12 performs the phase control so as to synchronize the reproduction clock with the reproduced digital signal utilizing the phase error amount, and inputs an output digital signal to the D/A converter 14. The D/A converter 14 converts an input signal into an analog electric signal, and outputs the signal. The electric signal which is output by the D/A converter 13 and the electric signal which is output by the D/A converter 14 are added. The oscillator 15 is operated based on an electric signal which is obtained by the addition, to generate a reproduction clock.

This series of operations allow the phase of the reproduction clock to be synchronized with the phase of the clock component of the reproduced digital data. Accordingly, the digital data recorded in the optical disk medium can be reproduced using the reproduction clock.

Hereinafter, respective circuit blocks constituting the frequency control and phase lock circuit according to the first embodiment is described in more detail.

Figure 2:
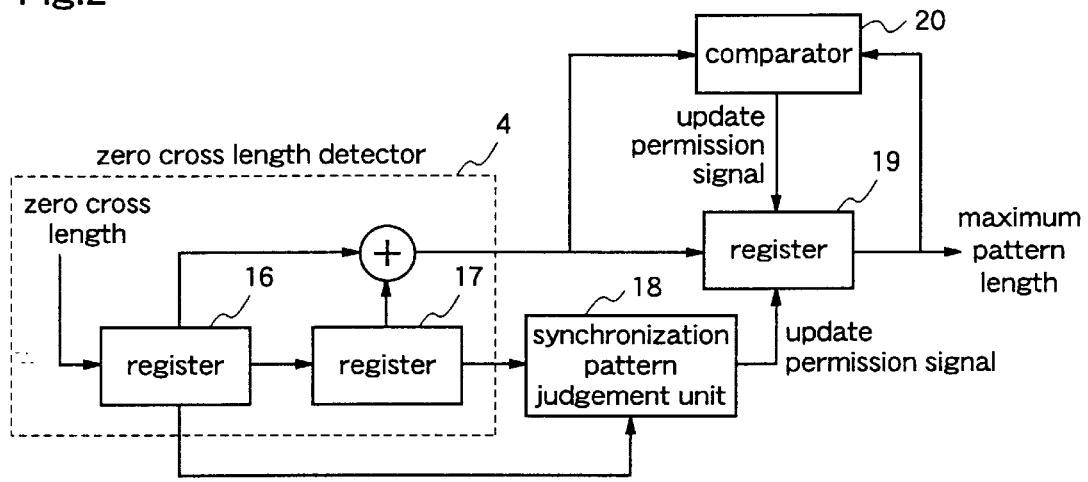
FIG. 2 is a block diagram illustrating a structure of a maximum pattern length detector 6 in the first embodiment.

Initially, the maximum pattern length detector 6 has a structure as shown in FIG. 2. To be specific, the maximum pattern detector 6 has a synchronization pattern judgement unit 18 for judging whether a detected pattern is a synchronization pattern based on a ratio between values of adjacent zero cross lengths. Adjacent zero cross lengths are detected by the zero cross length detector 4 by counting the zero cross length based on the reproduction clock and outputting the zero cross length, which values are held by a register 16 and a register 17. A comparator 20 compares the sum of the values held by the register 16 and register 17 with the magnitude of a value which has been held by a register 19. The detector 6 has a structure in which the comparator 20 outputs a update permission signal to the register 19 to update the register 19, only when the synchronization pattern judgement unit 18 judges the new value to be a synchronization pattern and the comparator 20 judges that the new value is larger than the previous value.

For example in DVDs, the recorded data sequence has patterns each consisting of contiguous 14T and 4T, which is called a synchronization pattern. When the length of this synchronization pattern is counted using the reproduction clock, which is synchronized with the clock component of the reproduced digital data, the synchronization pattern length is 14+4=18 as shown in FIG. 18(a). When the reproduction clock oscillates at a frequency twice as high as that of the clock component of the reproduced digital data, the synchronization pattern length is 28+8=36 as shown in FIG. 18(b). Inversely, when the reproduction clock oscillates at the half frequency, the synchronization pattern length is 7+2=9 as shown in FIG. 18(c). Accordingly, when the reproduced signal is not synchronized with the reproduction clock, the length 18T is not obtained. Therefore, the difference between an obtained synchronization pattern length and 18 is the cycle information.

Next, the description is given of a method for finding the synchronization pattern from the reproduced signal. The ratio between adjacent values is fundamentally kept at 14/4, regardless of the frequency of the reproduction clock. Therefore, this method can be realized by constructing the synchronization pattern judgement unit 18 which judges the synchronization pattern when a value obtained by eliminating lower 2 bits from the value of the register 17 (¼ of original data) is within the value of the register 16 ±1, in consideration of the detection dispersion.

Figure 3:
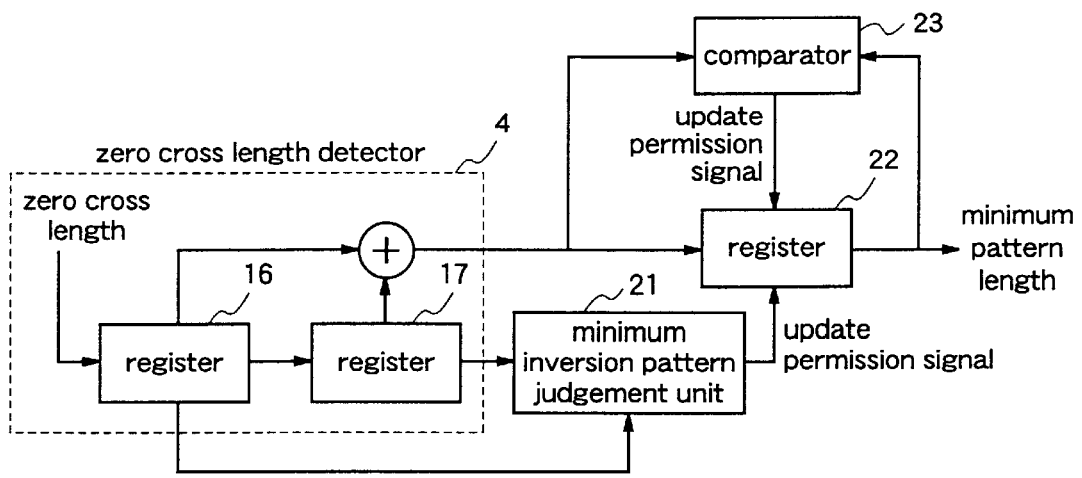
FIG. 3 is a block diagram illustrating a structure of a minimum pattern length detector 7 in the first embodiment.

The minimum pattern length detector 7 has a structure as shown in FIG. 3. The minimum pattern length detector 7 has a minimum inversion pattern judgement unit 21 for judging whether a detected pattern is the minimum inversion pattern based on a ratio between the values of the adjacent zero cross lengths. Adjacent zero cross lengths are detected by the zero cross detector 4 by counting the zero cross length based on the reproduction clock, and outputting the zero cross length, which values are held by the register 16 and register 17. A comparator 23 the sum of the values held by the register 16 and register 17 with the magnitude of a value which has been held by a register 22. The minimum pattern length detector 7 has a structure in which the comparator 23 outputs a update permission signal to the register 22 to update the register 22, only when the minimum pattern judgement unit 21 judges the minimum inversion pattern and the comparator 23 judges that the new value is less than the previous value.

For example in DVDs, the minimum inversion pattern in the sequence of the recorded data is 3T and 3T. When the minimum inversion pattern length is counted using the reproduction clock which is synchronized with the clock component of the reproduced digital data, the minimum inversion pattern length is 3+3=6 as shown in FIG. 19(a). However, when the reproduction clock oscillates at a frequency twice as high as that of the clock component of the reproduced digital data, the minimum inversion pattern length is 6+6=12 as shown in FIG. 19(b). Inversely, when the reproduction clock oscillates at the half frequency, the minimum inversion pattern length is 1.5+1.5=3 as shown in FIG. 19(c). (In reality, since 1.5 cannot be counted, the length 3 is obtained by the combination of 1+2.) Accordingly, when the reproduced signal is not synchronized with the reproduction clock, the length 6T is not obtained. Therefore, the difference between an obtained minimum inversion pattern length and 6 is the cycle information.

Then, the description is given of a method for finding the minimum inversion pattern from the reproduced signal. Like the synchronization pattern, the ratio between adjacent values is fundamentally kept at 1 to 1, regardless of the frequency of the reproduction clock. Therefore, this method can be realized by constructing the minimum inversion pattern judgement unit 21 which has a function of judging the minimum inversion pattern when a value of the register 17 is within a value of the register 16 ±1, in consideration of the detection dispersion.

The maximum pattern length detector 6 and the minimum pattern length detector 7 enable the stable detection of the synchronization pattern and minimum inversion pattern, independent of the change in the frequency of the reproduction clock.

Figure 4:
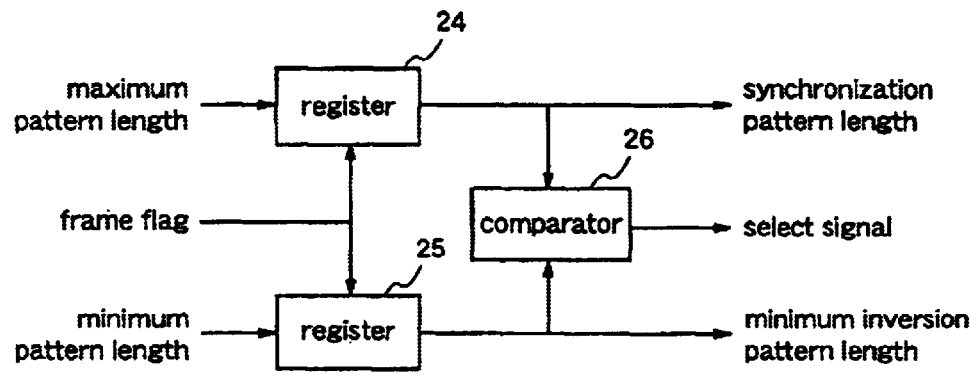
FIG. 4 is a block diagram illustrating a structure of a cycle information judgement unit 8 in the first embodiment.

The cycle information judgement unit 8 has structure as shown in FIG. 4. To be specific, the cycle information judgement unit 8 is constituted by a comparator 26 which receives a value of a register 24 as a means holding the maximum value of the synchronization pattern length in the period which is set by a frame flag output by the frame counter 5 and a value of a register 25 as a means holding the minimum value of the minimum inversion pattern, and generates a select signal for selecting cycle information which is regarded as optimal, utilizing the ratio between the synchronization pattern length as the output of the register 24 and the minimum inversion pattern length as the output of the register 25.

As described above, in DVDs for example, the synchronization pattern is 18T comprising 14T and 4T and the minimum inversion pattern is 6T comprising 3T and 3T.

Here, even when the frequency of the reproduction clock varies, the ratio between the both patterns, i.e., 3 to 1, is kept. Therefore, when the sum of a value which is obtained by eliminating 2 bits on the LBS side from a value of the register 24 (¼ of the original value) and a value which is obtained by eliminating 3 bits from the value (⅛ of the original value) is within a value of the register 25 ±1, the select signal is output so as to use the synchronization pattern length having higher detection precision as the cycle information. When the sum is not within this range, the select signal is output so as to use the minimum inversion pattern length having a lower detection frequency as the cycle information. Because of these functions, the results of the detection can be efficiently reflected to the control, whereby the speed of the frequency control can be increased. In addition, also in the seeking, when the detection of the synchronization pattern is difficult, the minimum inversion pattern is detected with priority and reflected to the control, thereby enabling the frequency control.

Figure 5:
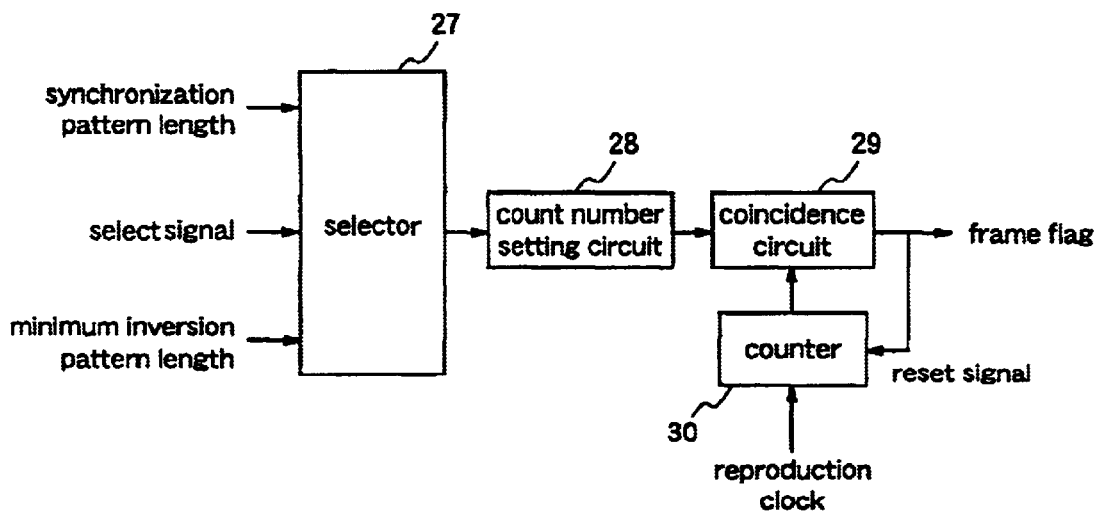
FIG. 5 is a block diagram illustrating a structure of a frame counter 5 in the first embodiment.

The frame counter 5 has a structure as shown in FIG. 5. To be specific, the frame counter 5 consists of a selector 27 for receiving the synchronization pattern length, the minimum inversion pattern length and the select signal as the output signals of the cycle information judgement unit 8 shown in FIG. 4, and selecting an output in accordance with the select signal, a count number setting circuit 28 for deciding the next count number in accordance with the signal selected by the selector 27, and a coincidence circuit 29 for outputting a frame flag when the output of the count number setting circuit 28 coincides with the output of a counter 30 which performs counting using the reproduction clock. The frame counter 5 has a function of resetting the counter 30 using the frame flag which is output by the coincidence circuit 29.

For example in DVDs, a recorded signal has the synchronization patterns at regular intervals, i.e., one in every 1488T, as shown in FIG. 22(a). However, when the interval between the synchronization patterns is detected using the reproduction clock, the interval between the synchronization patterns varies according to the amount of deviation between the frequency of the reproduction clock and the frequency of the clock component of the reproduced digital signal. When the reproduction clock has a frequency half as high as the frequency of the clock component of the reproduced digital signal, the detected interval is 744T as shown in FIG. 22(c). When the frequency of the reproduction clock is twice as high as that of the clock component of the reproduced digital signal, the detected interval is 2976T as shown in FIG. 22(b). Naturally, the detected interval between the synchronization patterns varies with time during the control for the frequency of the reproduction clock. Even when the frequency of the reproduction clock varies as described above, the ratio of the interval between the synchronization patterns to the synchronization pattern length is always 1488/18 and the ratio of the interval between the synchronization patterns to the minimum inversion pattern length is always 1488/6. Therefore, when the selector 27 selects the synchronization pattern length as the cycle information, the count number setting circuit 28 adds 7 bits to the output signal of the selector 27 on the LBS side (multiplies the original value by 128), whereby the detection period of the cycle information can be set as about 1.5 frames. (A frame is a unit of data which are divided by the synchronization pattern.) When the selector 27 selects the minimum inversion pattern length as the cycle information, the count number setting circuit 28 adds 8 bits to the output signal of the selector 27 on LBS side (multiplies the original value by 256), whereby the detection period of the cycle information can be set as about one frame. In this case, the count number can be manipulated by arbitrarily changing the number of bits manipulated by the count number setting circuit 28. These functions enable to optimize the period for detecting the cycle information on condition that at least one synchronization pattern is always included in the period for detecting the synchronization information, whereby the speed of the frequency pull-in of the reproduction clock can be increased.

Here, the above-mentioned "condition that at least one synchronization pattern is always included in the period for detecting the synchronization information" is required because if no synchronization pattern is included in one period for detecting the cycle information, the frequency error cannot be obtained from the synchronization pattern length. Accordingly, it is required that at least one synchronization pattern should be included in that period. On the other hand, when the period for detecting the cycle information is fixed, the period may include no synchronization pattern or inversely include more synchronization patterns than required, according to the amounts of frequency deviation. Therefore, the precision and efficiency in the detection of the synchronization pattern is deteriorated and the feedback in the frequency control is delayed, thereby requiring more time for the pull-in.

The frequency error detector 9 generates the frequency error in accordance with the principle as follows.

For example in DVDs, the sequence of the recorded data has the patterns each consisting of contiguous 14T and 4T, called a synchronization pattern, and the patterns each consisting of contiguous 3T and 3T, called a minimum inversion pattern. When the length of this synchronization pattern and the length of this minimum inversion pattern are counted using the reproduction clock which is synchronized with the clock component of the reproduced digital data, the synchronization pattern length and the minimum inversion pattern length are 18 and 6, respectively, as shown in FIGS. 18(a) and 19(a). However, when the reproduction clock oscillates at a frequency twice as high as that of the clock component of the reproduced digital data, these lengths are 36 and 12, respectively, as shown in FIGS. 18(b) and 19(b). Inversely, when the reproduction clock oscillates at the half frequency, these lengths are 9 and 3, respectively, as shown in FIGS. 18(c) and 19(c). Accordingly, when the reproduced signal is synchronized with the reproduction clock, the synchronization pattern length 18T and the minimum inversion pattern length 6T, which are obtained when the reproduced signal is synchronized with the reproduction clock, are not obtained. Therefore, a value which is obtained by subtracting 18 from an obtained synchronization pattern length, or a value which is obtained by subtracting 6 from an obtained minimum inversion pattern length is the frequency error signal. The cycle information judgement unit 8 decides which value is to be used.

Figure 15:
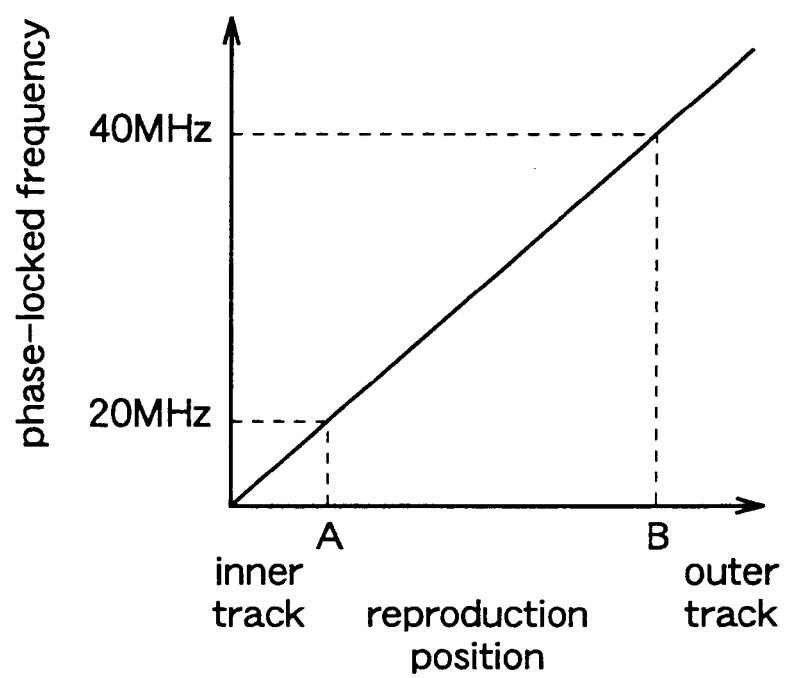
FIG. 15 is a diagram showing the relationship between the reproduction position and the phase-locked frequency at the CAV reproduction time.
Figure 16:
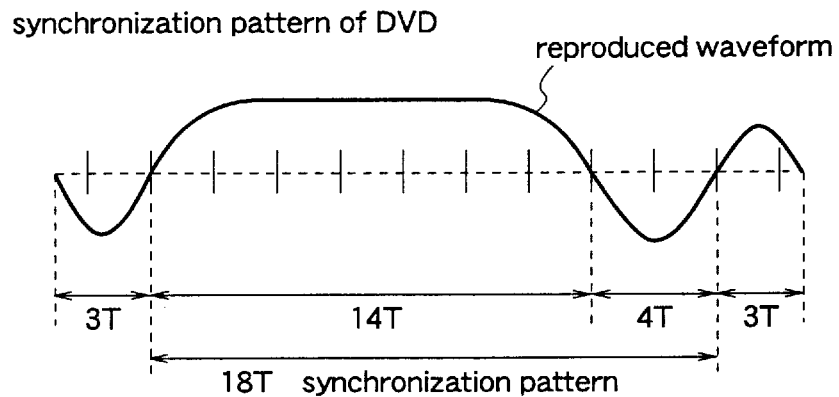
FIGS. 16(a), 16(b) and 16(c) are diagram showing the principle for detecting cycle information from a synchronization pattern length using the prior art high-frequency clock.
Figure 16:
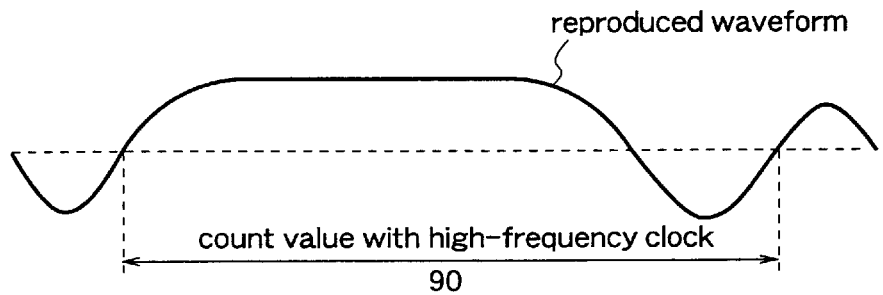
Figure 16:
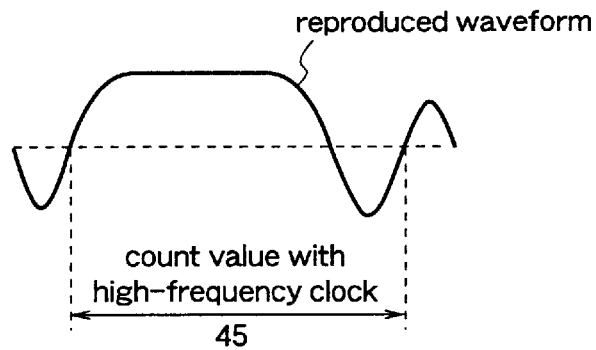
Figure 17:
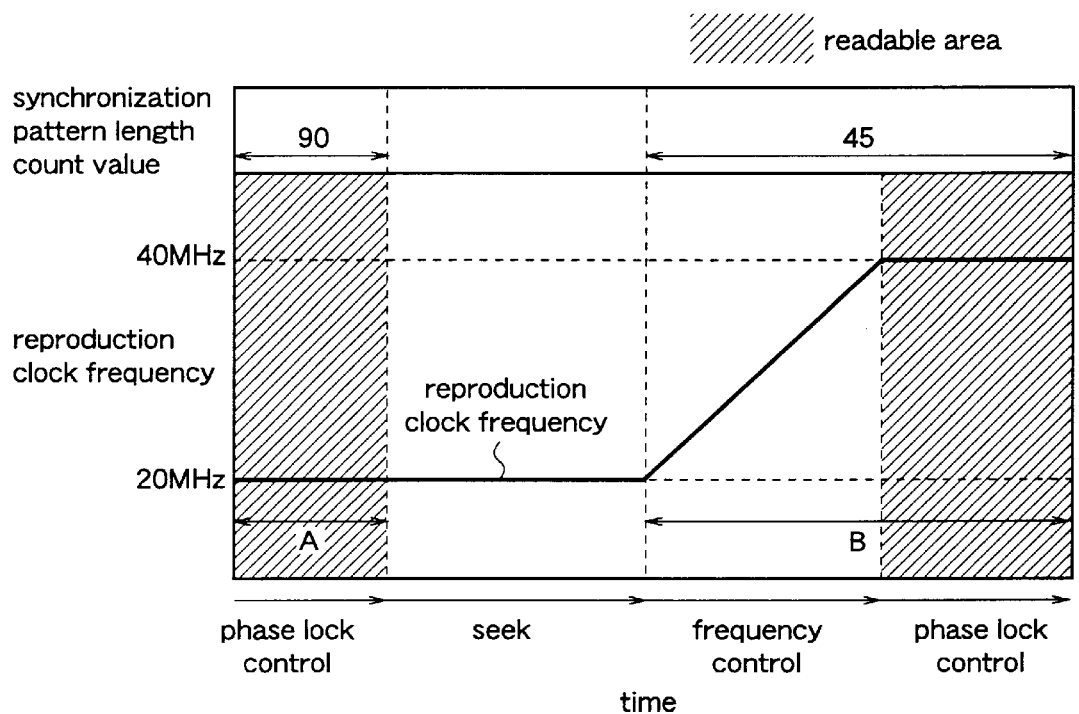
FIG. 17 is a diagram showing the flow of frequency control and phase control at the prior art CAV reproduction time.
Figure 18:
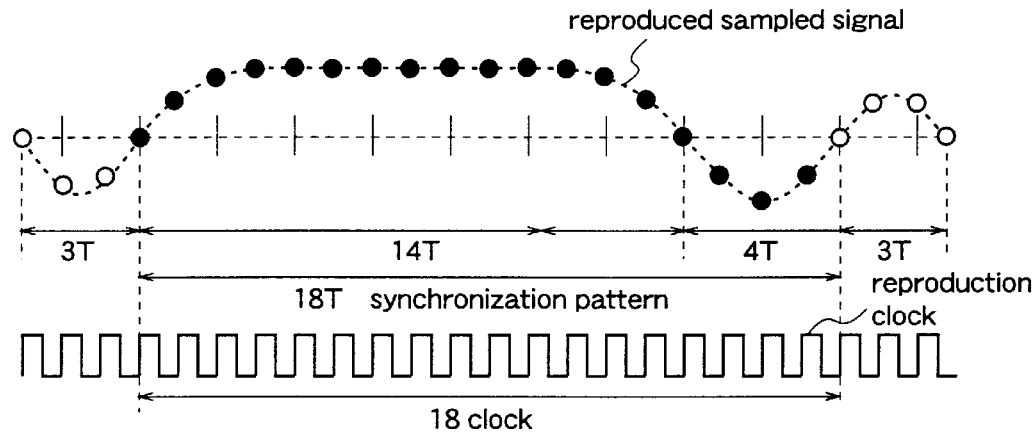
FIGS. 18(a), 18(b) and 18(c) are diagrams showing the principle for detecting a frequency error signal from a synchronization pattern length using a reproduction clock in the first embodiment.
Figure 18:
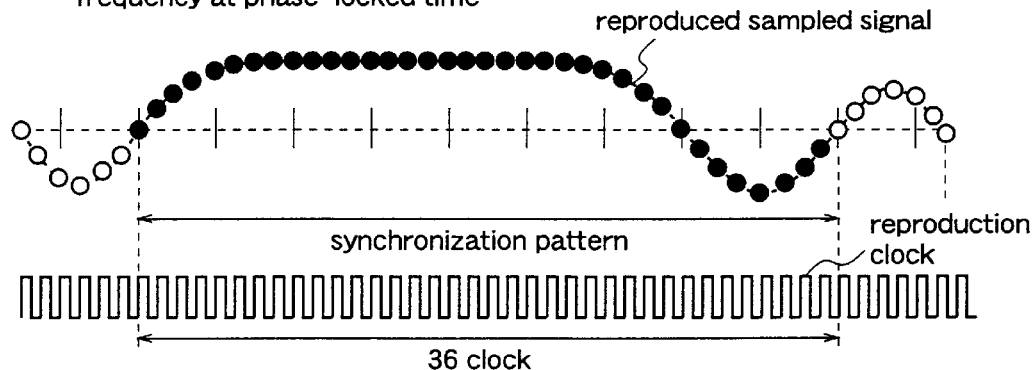
Figure 18:
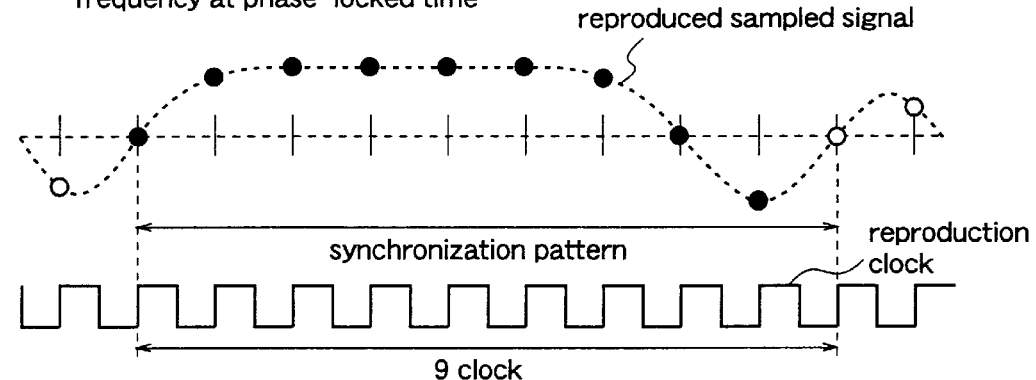
Figure 19:
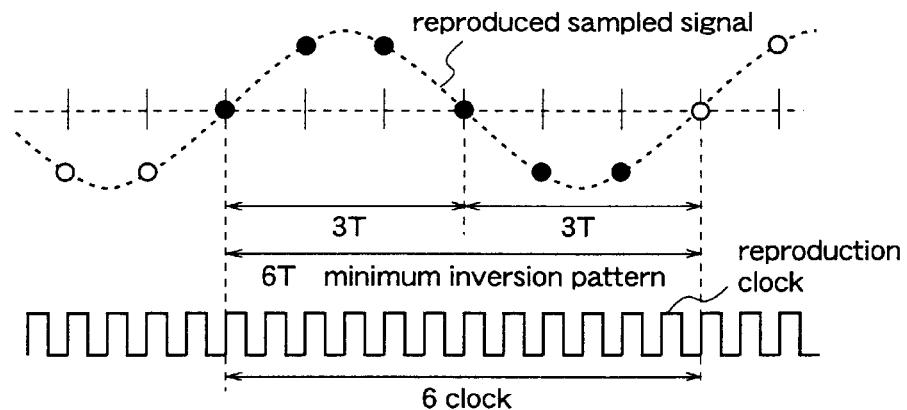
FIGS. 19(a), 19(b) and 19(c) are diagrams showing the principle for detecting a frequency error signal from a minimum inversion pattern using the reproduction clock in the first embodiment.
Figure 19:
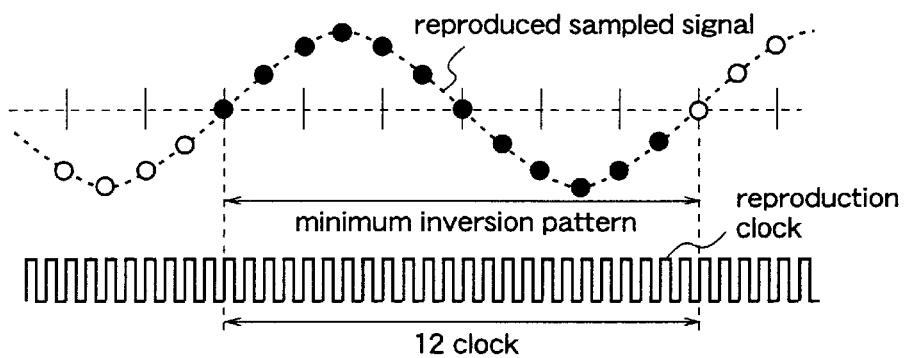
Figure 19:
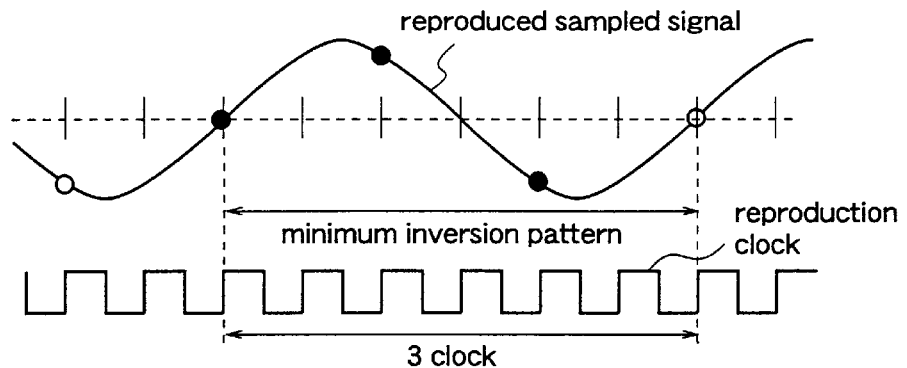
Figure 20:
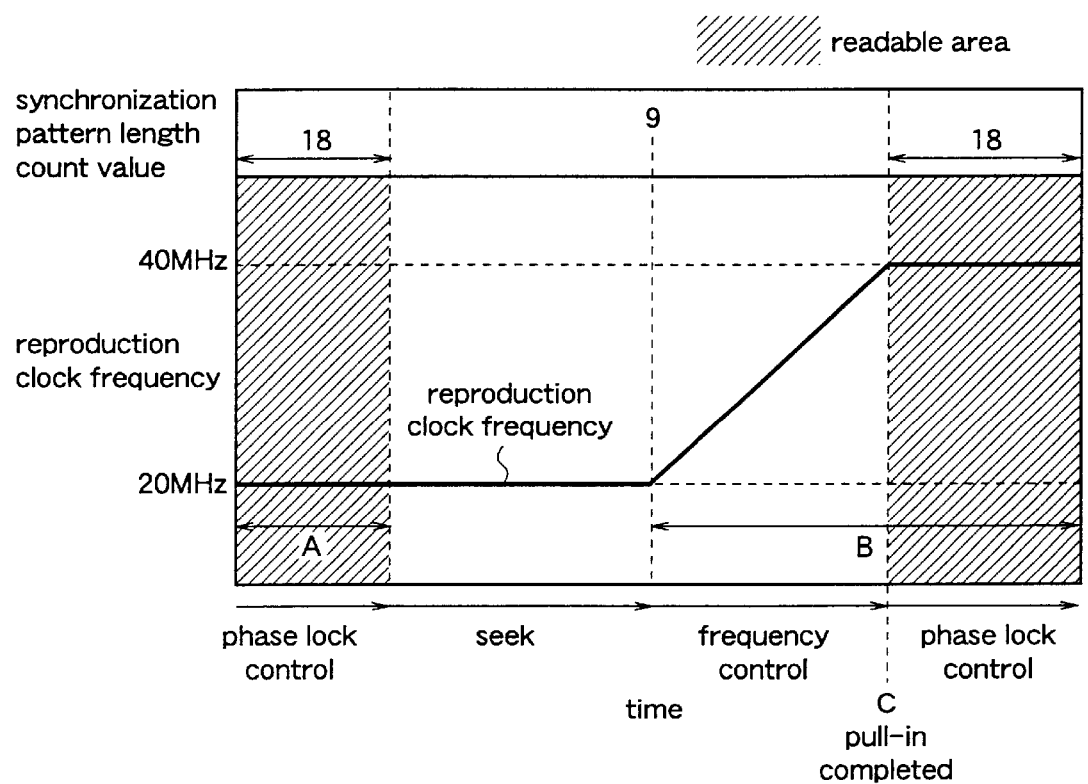
FIG. 20 is a diagram showing the flow of the frequency control and phase control at the CAV reproduction time in the first embodiment.
Figure 21:
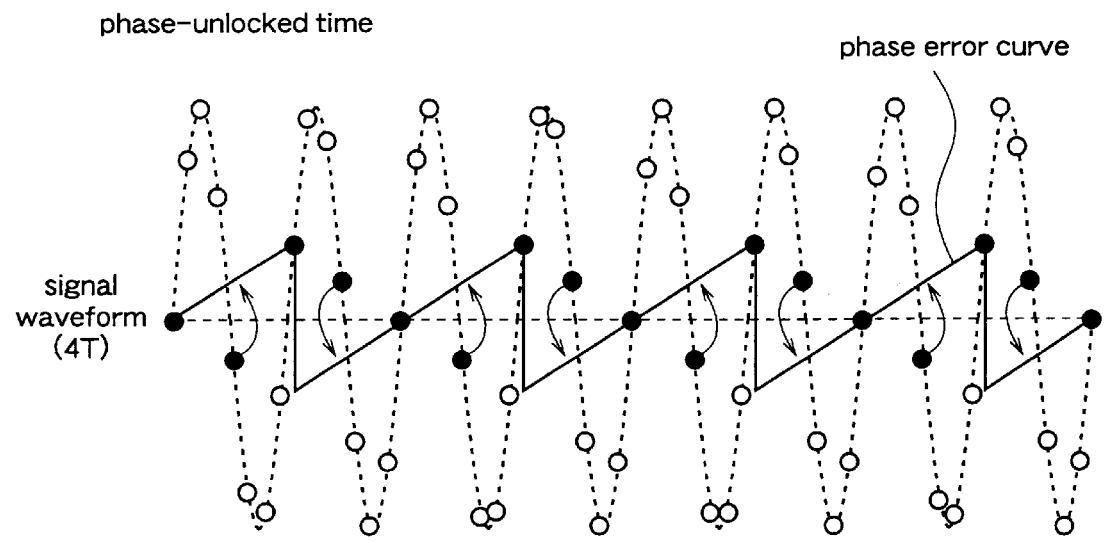
FIGS. 21(a) and 21(b) are diagrams showing the principle for detecting a phase error signal from reproduced sampled data in the first embodiment.
Figure 21:
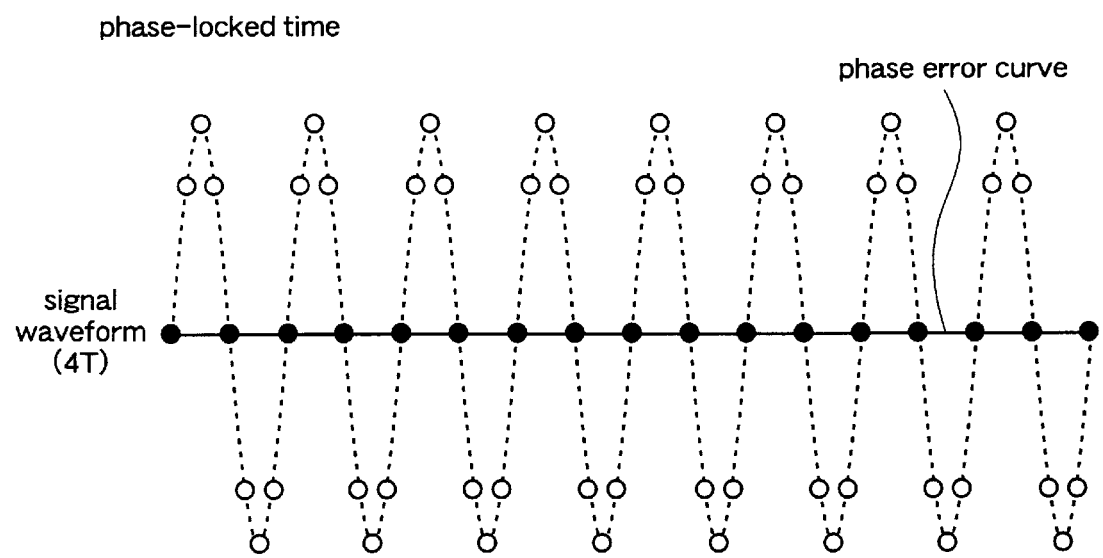
Figure 22:
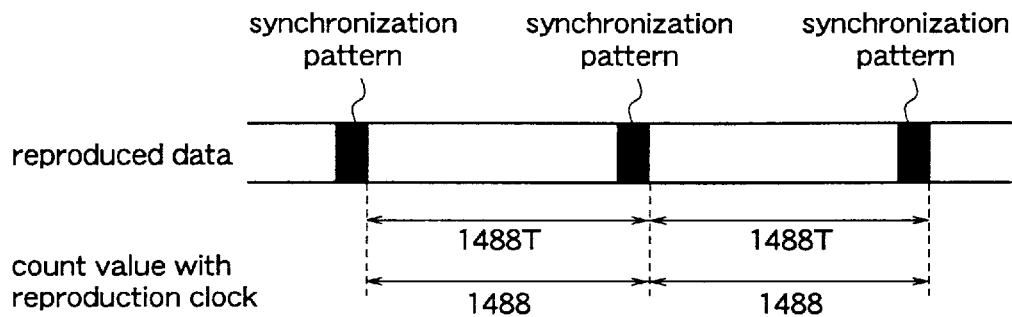
FIGS. 22(a), 22(b) and 22(c) are diagrams showing the principle for detecting a frequency error signal from a synchronization pattern interval using the reproduction clock in the second embodiment.
Figure 22:
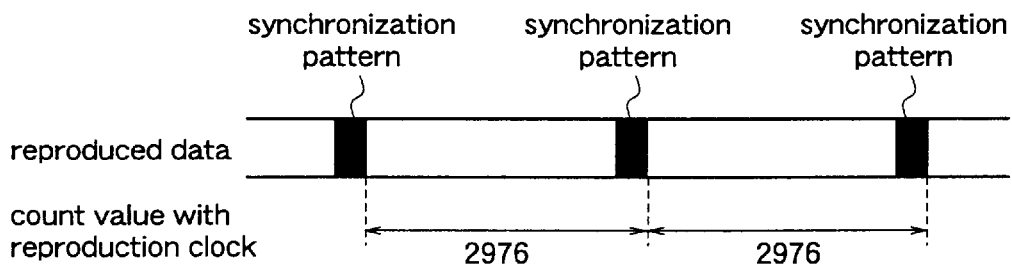
Figure 22:
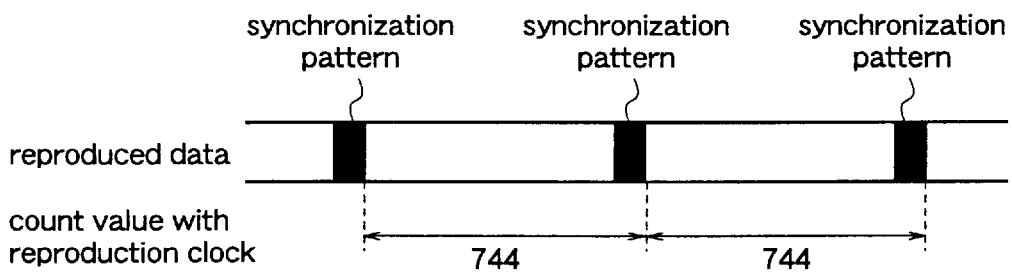

For example in the CAV reproduction in which the reproduction is performed with fixing rotational speed of the motor for rotating the recording medium, the linear velocity of the reproduced data varies according to the positions, i.e., as an accessed position is on an inner track or an outer track of the disc. Assume that the frequency which is synchronized with that of the reproduced data is 20 MHz at the position A on an inner track and 40 MHz at the position B on an outer track as shown in FIG. 15, and the reproduction clock which is output by the oscillator 15 is synchronized with the clock component of the reproduced data at the position A. Considering the case where the data on the position B are sought in a state where the reproduction is being performed at the position A, the reproduction clock which is output by the oscillator 15 just after the seeking is at 20 MHz, i.e., the phase-locked frequency at the position A, as shown in FIG. 20. However, when the synchronization pattern length is detected at the position B using the reproduction clock, the count number 9 which is half of 18 at the phase-locked time is detected, because the reproduction clock is half of the clock component of the reproduced data. When the minimum inversion pattern length is detected similarly, the count number 3 which is half of 6 at the phase-locked time is detected. In this case, the ratio of the synchronization pattern length to the minimum inversion pattern length is 3 to 1. Therefore, the cycle information judgement unit 8 judges that this synchronization pattern length is a reliable value. Then, the frequency error detector 9 outputs a value which is obtained by subtracting the synchronization pattern length at the phase-locked time from the detected synchronization pattern length, i.e., 9−18=−9, as the frequency error signal. Since the obtained frequency error signal has a negative value, it is judged that the frequency of the reproduction clock is lower than the frequency of the clock component of the reproduced data. Therefore, the feedback is performed via the frequency control loop filter 11 and the D/A converter 13 so as to increase the oscillated frequency which is output by the oscillator 15. At a timing when the synchronization pattern length is detected as 18 at a position C shown in FIG. 20, the frequency control is terminated, then the phase synchronization pull-in is started, whereby the phases of the reproduction clock can be synchronized with the reproduced data. In addition, when the feedback of the frequency error is performed during the seeking, it is also possible that the time required for the phase locking after the seeking is reduced.

The phase error detector 10 synchronizes the phase of the clock component of the reproduced data with the phase of the reproduction clock on the basis of the principle as shown in FIGS. 21(a) and 21(b). FIG. 21(a) shows a state where the frequency of the reproduction clock is slightly lower than the frequency of the clock component of the reproduced data. Assume that the reproduced data comprises a single frequency successively including 4T. With respect to sampled signals shown by black dots in FIG. 21(a) in the vicinity of the zero cross, information is employed as it is at the rising edge of the sampled signal, and the sign of the sampled signal is inverted between positive and negative at the falling edge. Thereby, phase error curves as shown in FIGS. 21(a) and 21(b) are obtained according to the amounts of phase shift. Here, the amplitude component of the sampled signal can be replaced with the shift of the sampled phase in the temporal direction. Thus, when the amplitude component of the sampled signal in the vicinity of the zero cross is used as the phase error signal in consideration of the rising edge and falling edge, the obtained positive sign shows the phase lag. Therefore, the feedback is performed so as to increase the frequency of the reproduction clock to lead the phase. Inversely, the obtained negative sign shows the phase lead. Therefore, the feedback is performed so as to reduce the frequency of the reproduction clock to delay the phase. By this control, the phase error signal approaches zero as shown in FIG. 21(b), whereby the phase of the reproduction clock can be synchronized with the phase of the clock component of the reproduced data.

As described above, the frequency control and phase lock circuit according to the first embodiment comprises the waveform equalization means for emphasizing the predetermined frequency band of the reproduced signal; the A/D converter for sampling the equalized signal to obtain the multi-bit digital data in accordance with the reproduction clock which is used when the equalized signal is reproduced as digital data; the low-band noise suppression means for suppressing the low-band noises in the signal sampled on the basis of the reproduction clock; the zero cross length detector for detecting the position where the signal whose low-band noises are suppressed crosses the zero level, counting the number of samples between adjacent zero crosses on the basis of the reproduction clock, and holding the counted number in the register; the frame counter for counting the specific period of one or more frames; the maximum pattern length detector and the minimum pattern length detector for detecting the maximum value and minimum value of the count value of the zero cross length in the predetermined period counted by the frame counter or the sums of the count values of the adjacent zero cross lengths, respectively; the cycle information judgement unit for comparing the maximum value of the pattern length with the minimum value, and selecting the optimal value utilizing the ratio between the maximum and minimum values as the cycle information; the frequency error detector having both the means for converting the difference between the cycle information selected by the cycle information judgement unit and the maximum or minimum pattern length which is to be detected at the phase-locked time, into the frequency error and outputting the frequency error, and the means for deciding the synchronization pattern from the maximum pattern length, converting the interval between the synchronization patterns into the frequency error, and outputting the frequency error; the frequency control circuit for performing the control as far as an area where the reproduction clock can be synchronized with the reproduced digital signal on the basis of the output of the frequency error detector; the phase error detector for detecting the phase information from the signal whose low-band noises are suppressed; the phase control circuit for controlling the phase so as to synchronize the reproduction clock with the reproduced digital signal on the basis of the output of the phase error detector; and the oscillator which adds the output of the frequency control circuit and the output of the phase control circuit, and oscillates the reproduction clock on the basis of the sum, whereby the phase synchronization pull-in in the reproduction of digital data can be realized. Therefore, the reproduction clock is used in place of the high-frequency clock, the cycle information and the phase information are detected from the multi-bit reproduced digital data which are obtained by the sampling on the basis of the reproduction clock, and the control is performed so as to synchronize the phase of the reproduction clock with the phase of the clock component of the reproduced digital data, whereby the clock can be unified in one system. Accordingly, the high-speed and stable phase synchronization pull-in can be realized using the reproduction clock also in the state where the linear velocity of the reproduced digital data varies.

In addition, the frequency control and phase lock circuit selects an optimal one of the maximum pattern length and the minimum pattern length, and utilizes the selected pattern length as the cycle information. Therefore, not only the frequency pull-in of the reproduction clock can be performed at high speed but also the frequency control can be performed also at the seeking time when the cycle detection is regarded as difficult.

Further, the maximum pattern length detector and the minimum pattern length detector respectively have the synchronization pattern judgement unit and the minimum inversion pattern judgement unit, decide the respective patterns, and update the maximum pattern length and the minimum pattern length only when the values are larger and smaller than the held values, respectively. Therefore, also when the deviation between the frequency of the reproduction clock and the frequency of the clock component of the reproduced digital data is large, the pattern detection can be performed with high precision. Accordingly, the precision in the frequency detection is increased, whereby the frequency pull-in of the reproduction clock can be stably performed.

Further, the cycle information judgement unit has the registers respectively holding the maximum pattern length and the minimum pattern length which are obtained in the predetermined period calculated by the frame counter, at the end of the period, and automatically sets a period which is to be counted by the frame counter next, based on the pattern length regarded as optimal as the cycle information, which length is obtained by comparing the respective values held by the registers in the cycle information judgement unit. Therefore, the detection period for detecting one synchronization pattern included in one frame can be automatically decided based on the cycle information, whereby the efficiency in the detection of the synchronization pattern can be improved and the frequency pull-in of the reproduction clock can be performed at high speed.

Embodiment 2

A frequency control and phase lock circuit according to a second embodiment of the present invention will be described with reference to a block diagram of FIG. 6.

Figure 6:
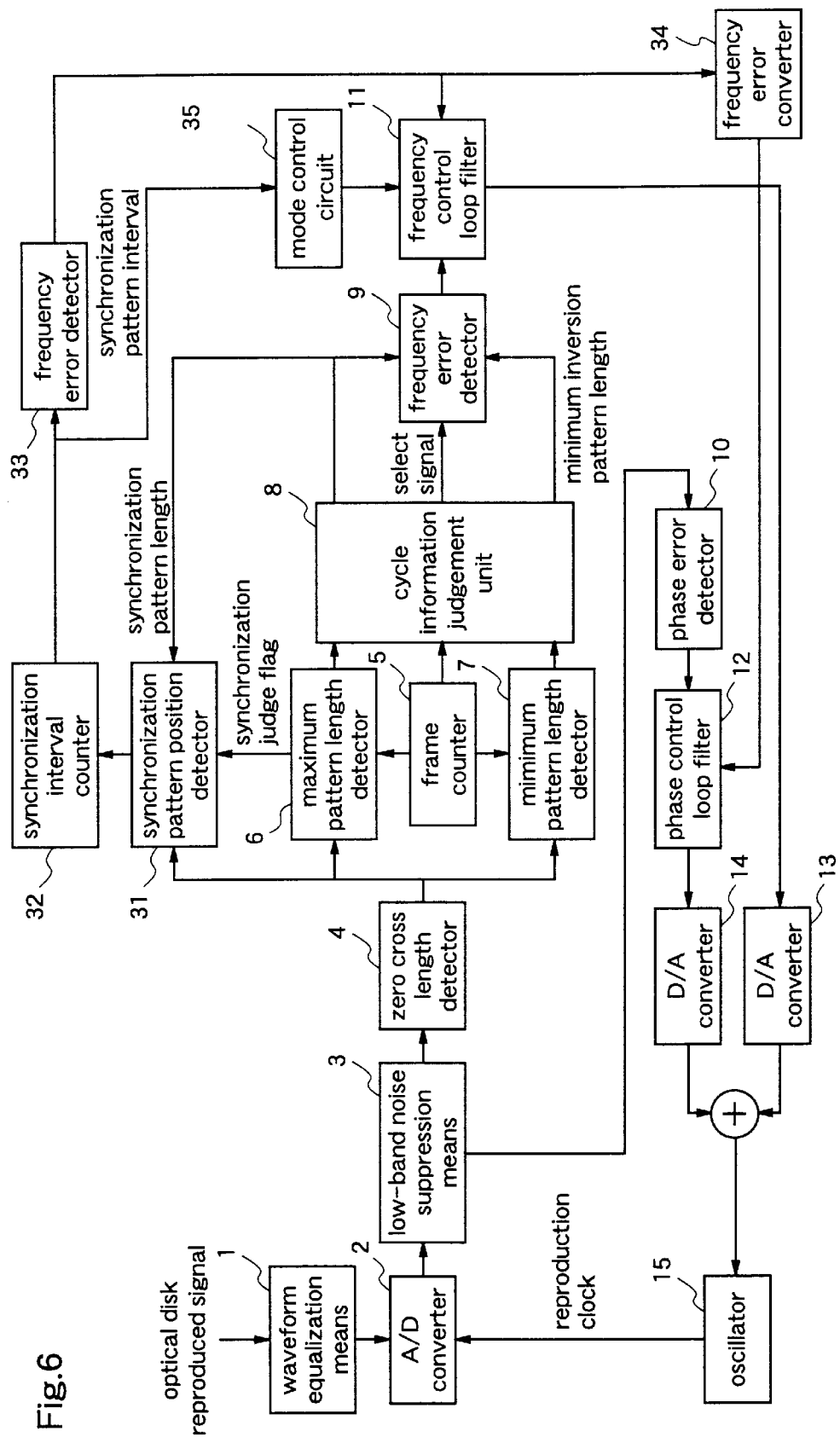
FIG. 6 is a block diagram illustrating a frequency control and phase lock circuit according to a second embodiment of the present invention.

In FIG. 6, numeral 1 denotes a waveform equalization means for subjecting an optical disk reproduced signal to the compensation so as to emphasize the high frequency band. Numeral 2 denotes an A/D converter for converting an analog signal into a digital signal in accordance with a reproduction clock which is used when an output signal of the waveform equalization means 1 is reproduced as digital data. The A/D converter 2 samples an analog signal to obtain a multi-bit digital signal. Numeral 3 denotes a low-band noise suppression means for suppressing low-band noise components included in the multi-bit reproduced digital signal obtained by the sampling. Numeral 4 denotes a zero cross length detector for continuously detecting the position where the reproduced digital signal, whose low-band noise components are suppressed, crosses the zero level, counting the number of samples between adjacent zero crosses based on the reproduction clock, and holding the counted number in a register as a zero cross length. Numeral 5 denotes a frame counter for counting a predetermined period of one or more frames using the output of the zero cross length detector 4 based on the reproduction clock. Numeral 6 denotes a maximum pattern length detector for detecting the maximum value of the sum of the count values of adjacent zero cross lengths in the period, which is set by the frame counter 5, and holding the maximum value in a register as the maximum pattern length. Numeral 7 denotes a minimum pattern length detector for detecting the minimum value of the sum of the count values of the adjacent zero cross lengths in the period set by the frame counter 5, and holding the minimum value in a register as the minimum pattern length. Numeral 8 denotes a cycle information judgement unit for comparing the cycle information, which is obtained by the maximum pattern length detector 6, with the cycle information, which is obtained by the minimum pattern length detector 7, selecting an optimal value as the cycle information utilizing the ratio between the both information, and outputting a select signal. Numeral 9 denotes a frequency error detector for converting the difference between the cycle information selected in accordance with the select signal and the maximum or minimum pattern length, which is to be detected at the phase-locked time, into a frequency error, and outputting the frequency error. Numeral 31 denotes a synchronization pattern position detector for detecting the position of a synchronization pattern using the sum of the adjacent zero cross lengths, which are detected by the zero cross length detector 4, a synchronization judge flag, which is output by the maximum pattern length detector 6, and a synchronization pattern length, which is output by the cycle information judgement unit 8. Numeral 32 denotes a synchronization interval counter for detecting the interval between the synchronization patterns based on the detection result of the synchronization pattern position. Numeral 33 denotes a frequency error detector for converting the cycle information, which is detected by the synchronization interval counter 32 into a frequency error, and outputting the frequency error. Numeral 10 denotes a phase error detector for detecting phase information of the reproduced digital data using an output which is obtained by the low-band noise suppression means 3. Numeral 34 denotes a frequency error converter for converting the output of the frequency error detector 33 into phase error information, and outputting the phase error information. Numeral 35 denotes a mode control circuit as a means for selecting the output of the frequency error detector 9 or the output of the frequency error detector 33, to perform the frequency control. The mode control circuit 35 receives the interval between the synchronization patterns as an output signal of the synchronization interval counter 32, executes the operation based on the signal, and outputs one of plural mode signals for deciding the control state. Numeral 11 denotes a frequency control loop filter for performing the frequency control as far as an area where the reproduction clock can be synchronized with the reproduced digital signal using the amount of the frequency error selected by the mode control circuit 35. Numeral 12 denotes a phase control loop filter for performing the phase control so as to synchronize the reproduction clock with the reproduced digital signal using the output of the phase error detector 10 and the output of the frequency error converter 34. Numerals 13 and 14 denote D/A converters each converting a digital signal into an analog electric signal, and outputting the analog electric signal. Numeral 15 denotes an oscillator for the added analog electric signals which are obtained by the D/A converters 13 and 14, respectively, and generating a reproduction clock based on an electric signal which is obtained by the addition.

Next, the operation of the so-constructed frequency control and phase lock circuit according to the second embodiment of the present invention will be described.

An output signal, which is obtained by subjecting an optical disk reproduced signal to the compensation by the waveform equalization means 1 so as to emphasize the high frequency band, is output to the A/D converter 2. The A/D converter 2 converts the output signal, which is obtained by subjecting the optical disk reproduced signal to the compensation, into a digital signal using the reproduction clock which is generated by the oscillator 15, and performs sampling to obtain a multi-bit reproduced digital signal. The signal obtained by the sampling is in phase with the reproduction clock. Thereafter, all of data processing such as the counting is performed based on the reproduction clock. The multi-bit reproduced digital signal, which is obtained by the sampling, is input to the low-band noise suppression means 3, to suppress the low-band noise components included in the reproduced digital signal.

Then, the reproduced digital signal, whose low-band noise components are suppressed, is input to the zero cross length detector 4. The zero cross length detector 4 continuously detects the position where the reproduced digital signal crosses the zero level, counts the number of samples between adjacent zero crosses based on the reproduction clock, and holds the counted number in the register as the zero cross length. Further, with utilizing the output of the zero cross length detector 4, the maximum pattern length detector 6 and the minimum pattern length detector 7 detect the maximum value and minimum value of the sum of the count values of the adjacent zero cross lengths in the period, which is set by the frame counter 5 counting a specific period of one or more frames based on the reproduction clock, and hold the values in the registers, respectively, to obtain information which is inversely proportional to the linear velocity of the reproduced digital data.

The cycle information which is obtained by the maximum pattern length detector 6 and the minimum pattern length detector 7, i.e., the maximum pattern length and the minimum pattern length are compared with each other by the cycle information judgement unit 8. An optimal value as the cycle information is selected using the ratio between the maximum pattern length and the minimum pattern length, and a select signal indicating the optimal value is output to the frequency error detector 9. The frequency error detector 9 converts the difference between the cycle information selected in accordance with the select signal and the maximum or minimum pattern length, which is to be detected at the phase-locked time, into a frequency error, and decides the amount of the frequency error to perform the frequency control of the reproduction clock.

On the other hand, the sum of the adjacent zero cross lengths, which are detected by the zero cross detector 4, the synchronization judge flag, which is output by the maximum pattern length detector 6, and the synchronization pattern length, which is output by the cycle information judgement unit 8, are input to the synchronization pattern position detector 31. Thereby, the position of the synchronization pattern is detected. Then, the frequency error amount for performing the frequency control of the reproduction clock is decided by the synchronization interval counter 32 for detecting the interval between the synchronization patterns based on the detection result, and the frequency error detector 33 for converting the cycle information, which is detected by the synchronization interval counter 32, into a frequency error and outputting the frequency error.

The phase information of the reproduced digital data is detected by the phase error detector 10 using the output, which is obtained by the low-band noise suppression means 3, and the phase error amount for performing control to synchronize the phase of the reproduction clock with the phase of the reproduced digital data is decided. In addition, the output of the frequency error detector 33 is converted into the phase error information by the frequency error converter 34. The synchronization pattern interval as the output signal of the synchronization interval counter 32 is input to the mode control circuit 35 as the means for selecting the output of the frequency error detector 9 or the output of the frequency error detector 34 to perform the frequency control. The mode control circuit 35 performs the operation based on the signal, and outputs one of the plural mode signals for deciding the control state.

The frequency error amount, which is selected by the mode control circuit 35 is input to the frequency control loop filter 11. Then, the control of the frequency is performed by a frequency control loop including the loop filter 11, as far as an area where the reproduction clock can be synchronized with the reproduced digital data. A digital signal, which is output by the frequency control loop filter 11 is output to the D/A converter 13. The control of the phase is performed by a phase control loop including the phase control loop filter 12 using the output of the phase error detector 10 and the output of the frequency error converter 34 so as to synchronize the reproduction clock with the reproduced digital signal. A digital signal, which is output by the phase control loop filter 12 as a result of the phase control is converted by the D/A converter 14 into an analog electric signal. An analog electric signal which is obtained by the D/A converter 13 and the analog electric signal, which is obtained by the D/A converter 14 are added. The oscillator 15 is operated based on an electric signal, which is obtained by the addition, and generates a reproduction clock.

These series of the operations enable to synchronize the phase of the reproduction clock with the phase of the clock component of the reproduced digital data. Therefore, the digital data, which are recorded on the optical disk medium, can be reproduced using the reproduction clock.

Hereinafter, the respective circuit blocks constituting the frequency control and phase lock circuit according to the second embodiment will be described in more detail.

Figure 7:
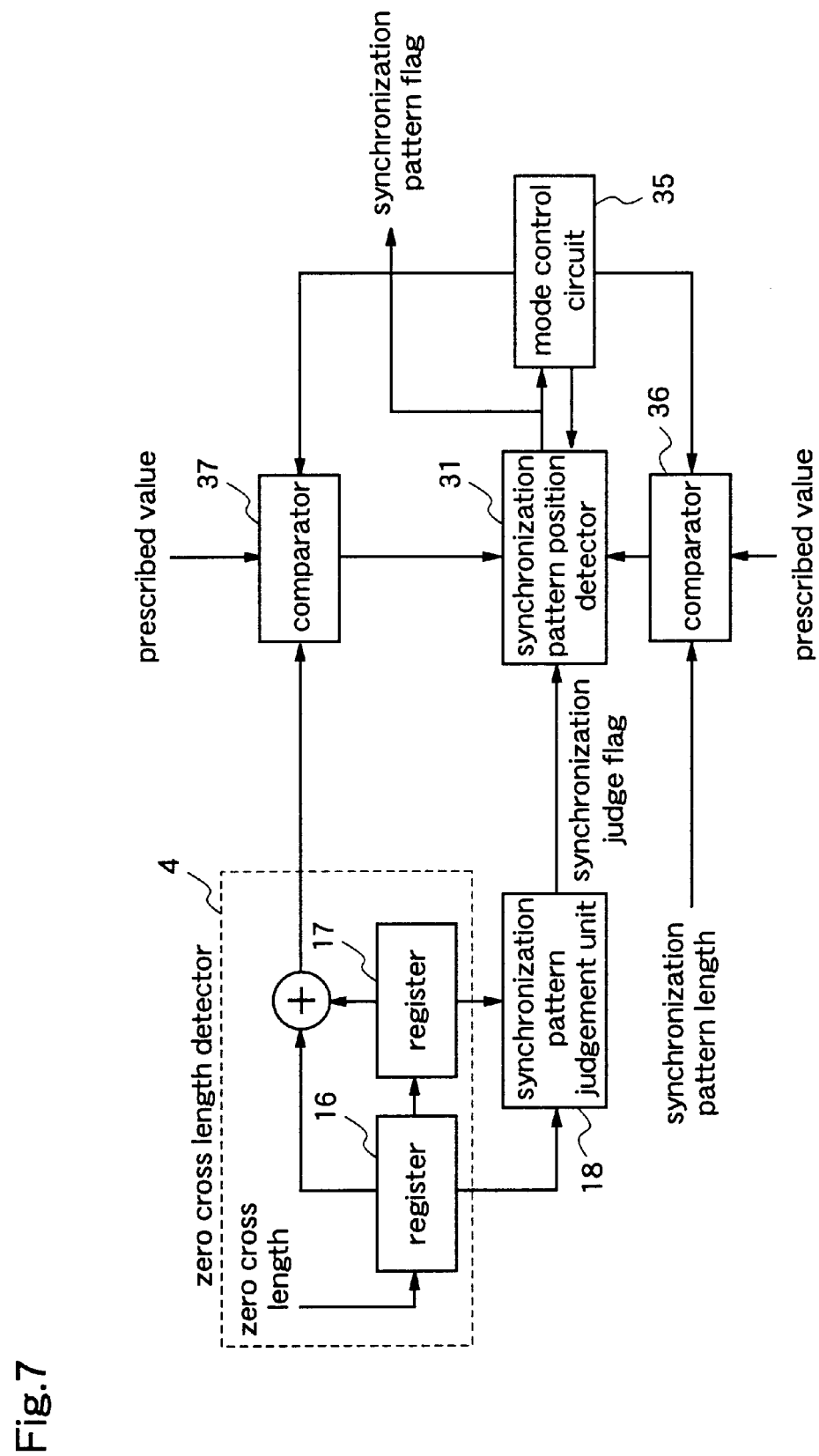
FIG. 7 is a block diagram illustrating a structure of a synchronization pattern detection means in the second embodiment.

A synchronization pattern detection means including the synchronization pattern position detector 31 has a structure as shown in FIG. 7. To be specific, the synchronization pattern detection means has a structure in which a synchronization pattern flag is output by the synchronization pattern position judgement unit 31 for detecting the position of the synchronization pattern using the synchronization judge flag which is output by the synchronization pattern judgement unit 18, an output of a comparator 36 for comparing the synchronization pattern length as the maximum pattern length in the period counted by the frame counter 5 with a prescribed value of the synchronization pattern length, and an output of a comparator 37 for comparing the sum of the adjacent zero cross lengths, which are detected by the zero cross length detector 4 as outputs of the register 16 and the register 17 with a prescribed value of the synchronization pattern length, and criteria of the comparator 36 and the comparator 37 and the operation condition of the synchronization pattern position detector 31 are switched in accordance with the mode signal which is output by the mode control circuit 35 having a function of deciding the control state based on the synchronization pattern flag. Accordingly, in an area where the deviation in the frequency is larger, the detection of the position of the synchronization pattern is performed in a rough mode, thereby increasing the detection rate. In an area where the frequency deviation is smaller, the detection of the position of the synchronization pattern is performed in a fine mode, thereby attaching importance to the detection precision. Thereby, the detection of the position of the synchronization pattern is changed according to the amount of the frequency deviation, to perform the frequency control at higher speed. At this time, the mode signal which is output by the mode control circuit 35 reflects the deviation in the frequencies of the reproduction clock and the clock component of the reproduced digital data.

For example in DVDs, the prescribed synchronization pattern is 18T. When the mode signal, which is output by the mode control circuit 35, indicates the frequency deviation is larger, the synchronization pattern position detector 31 outputs the synchronization pattern flag, only when the synchronization pattern judgement unit 18 satisfies the condition and the synchronization pattern length is within 18±n in the comparator 36 and the sum of the values of the register 16 and register 17 is within 18±m in the comparator 37. When the mode signal, which is output by the mode control circuit 35, indicates the frequency deviation is smaller, the synchronization pattern position detector 31 outputs the synchronization pattern flag, only when the synchronization pattern judgement unit 18 satisfies the condition and the sum of the values of the register 16 and register 17 is equal to 18 in the comparator 37. These functions improve the precision and efficiency in the detection of the synchronization pattern interval.

The frequency error detector 33 detects a frequency error signal based on the principle as shown in FIGS. 22(a), 22(b) and 22(c).

For example, a recorded code in DVD has patterns, which are called synchronization patterns, each being constituted by the combination of 14T and 4T, at regular intervals, i.e., one in every 1488T. The synchronization pattern detector 31 specifies the position of the synchronization pattern and the synchronization interval counter 32 counts the interval between detected synchronization patterns based on the reproduction clock. When the interval between the synchronization patterns is counted using the reproduction clock, which is synchronized with the clock component of the reproduced digital data, the synchronization pattern interval is 1488 as shown in FIG. 22(a). However, when the reproduction clock oscillates at a frequency twice as high as that of the clock component of the reproduced digital data, the synchronization pattern interval is 2976 as shown in FIG. 22(b). Inversely, when the reproduction clock oscillates at the half frequency, the synchronization pattern interval is 744 as shown in FIG. 22(c). Accordingly, when the reproduced signal is not synchronized with the reproduction clock, the synchronization pattern interval 1488T is not obtained. Therefore, a value, which is obtained by subtracting 1488 from the obtained synchronization pattern interval, is a frequency error signal. When the obtained frequency error signal is positive, the frequency of the reproduction clock is higher than the frequency of the clock component of the reproduced data. Therefore, the feedback is performed so as to reduce the frequency oscillated by the oscillator 15. When the obtained frequency error signal is negative, the frequency of the reproduction clock is lower than the frequency of the clock component of the reproduced data. Therefore, the feedback is performed so as to increase the frequency oscillated by the oscillator 15. Thereby, it is possible to make the synchronization pattern interval approach 1488. Accordingly, the frequency control of the reproduction clock can be performed at precision 1488/18 times as high as that in the case where the control is performed based on the synchronization pattern length 18T.

Figure 8:
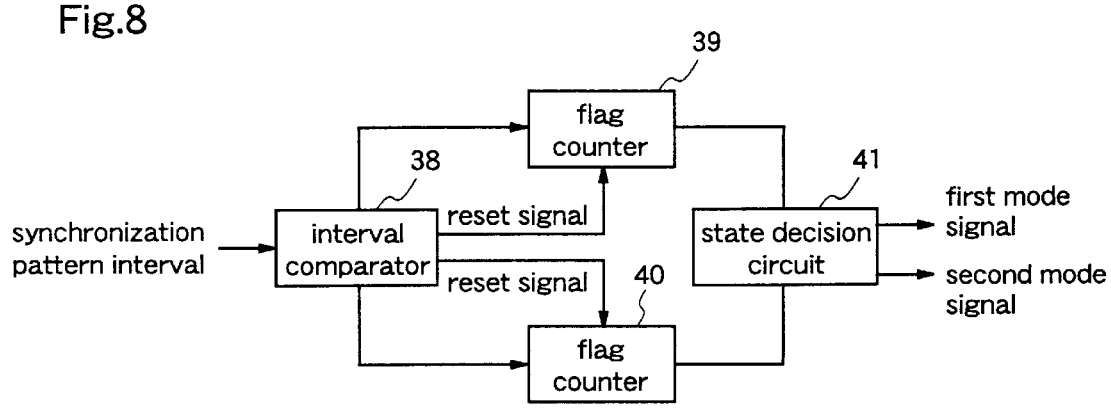
FIG. 8 is a block diagram illustrating a structure of a mode control circuit 35 in the second embodiment.

The mode control circuit 35 has a structure as shown in FIG. 8. To be specific, the interval between synchronization patterns as the output of the synchronization interval counter 32 is input to an interval comparator 38 for deciding whether the interval satisfies a predetermined condition. When the interval satisfies the predetermined condition, a flag counter 39 performs counting up. When the interval does not satisfy the predetermined condition, a flag counter 40 performs counting up. The flag counters 39 and 40 are reset in antithetical conditions. Count values of the counters 39 and 40 show the continuous amounts of states of the synchronization pattern interval. When the count value is equal to a specific value of an external register, a state decision circuit 41 decides the control state in accordance with a predetermined rule, outputs a first mode signal or a second mode signal, and automatically switches the control state of each circuit for managing the frequency control and phase lock control in accordance with the output signal. For example, when the first mode signal or second mode signal, which is output by the mode control circuit 35, indicates that the deviation between the frequency of the reproduction clock and the frequency of the clock component of the reproduced digital data is larger, the output of the frequency error detector 9 is selected as the frequency error signal. When the signal indicates that the deviation between the frequency of the reproduction clock and the frequency of the clock component of the reproduced digital data is smaller, the output of the frequency error detector 33 is selected as the frequency error signal. Thereby, the control can be performed with utilizing the advantage that the pattern length of a specific pattern constituted by the synchronization pattern or the minimum inversion pattern can be detected more easily than the synchronization pattern interval in an area where the frequency deviation is larger, and the synchronization pattern interval has a higher detection precision in an area where the frequency deviation is smaller. Therefore, the frequency pull-in can be performed at high speed and with good stability. When the first mode signal or the second mode signal, which is output by the mode control circuit 35, indicates the state where the phases can be synchronized with each other, the control of the phase is started so as to synchronize the reproduction clock with the reproduced digital signal using the output of the phase error detector 10 and the output of the frequency error converter 34. Thereby, the operation can be shifted smoothly from the frequency pull-in to the phase pull-in. Further, the control amount of the frequency control loop filter 11 or the phase control loop filter 12 is switched using the first mode signal or the second mode signal, whereby the time for the phase locking can be further reduced. The mode control circuit 35, which automatically obtains the frequency deviation between the reproduction clock and the clock component of the reproduced digital data and decides the control state is used to continuously and automatically switch the control state. Thereby, the frequency pull-in and phase pull-in of the reproduction clock can be performed at high speed and with good stability.

The synchronization interval counter 32 has a structure comprising a means for resetting the plural mode signals for deciding the control state to specific state when a value of the synchronization interval counter 32 exceeds a predetermined threshold. To be specific, when the value of the synchronization interval counter 32 is increased too much, it is considered that no synchronization pattern is found. Accordingly, the means changes the control using the plural mode signals, to a mode in which the frequency error is obtained based on the synchronization pattern length or the minimum inversion pattern length to perform the frequency control, as the control which is used when the frequency deviation is larger. Here, when the synchronization pattern flag is detected, the synchronization interval counter 32 is reset and set to have an initial value.

For example in DVDs, when the reproduction clock is in phase with the reproduced digital data, the value of the synchronization interval counter 32, which is counted with using the reproduction clock, ought not to exceed 1488 as long as the operation is performed normally. When the threshold is set to a value of 1000 or more, in consideration of omission in the detection, a case where the synchronization interval counter 32 has a value more than that threshold is regarded as an abnormal state. Then, the mode control circuit 35 is set so that the frequency control is performed based on data of the frequency error detected from the synchronization pattern interval, thereby performing the re-pull-in of the frequency and the phase. These functions enable to determine the abnormal state of the control. When the state is judged as abnormal, the operation of self-restoration is performed, whereby the restoration time in the abnormal operation can be reduced.

Figure 9:
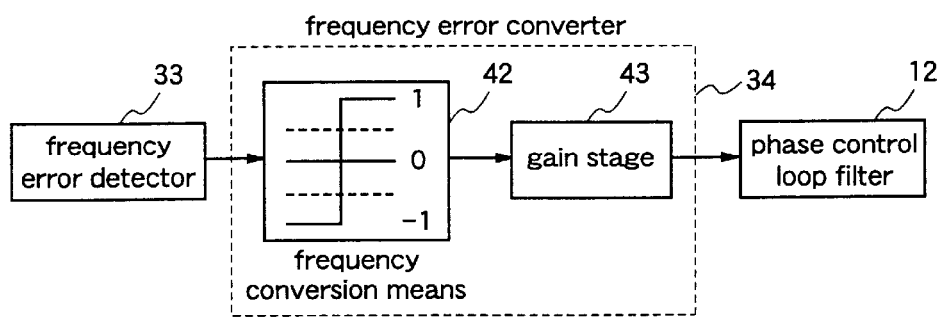
FIG. 9 is a block diagram illustrating a structure of a frequency error converter 34 in the second embodiment.

The frequency error converter 34 has a structure as shown in FIG. 9. The frequency error converter 34 has a frequency conversion means 42 for dividing the outputs of the frequency error detector 33 between +1, 0 and −1 according to the values and a gain stage 43 for amplifying the output of the frequency conversion means 42 by a predetermined gain, and operates the phase control loop filter 12 using the output of the gain stage 43. Accordingly, it is possible to make the frequency of the reproduction clock approach the frequency of the clock component of the reproduced digital data, by the resolution of the frequency which can be controlled by the frequency control loop filter 11 or more. Therefore, even when a capture range as a phase pull-in range of the phase-locked loop is narrow, a stable phase synchronization pull-in can be performed.

Figure 10:
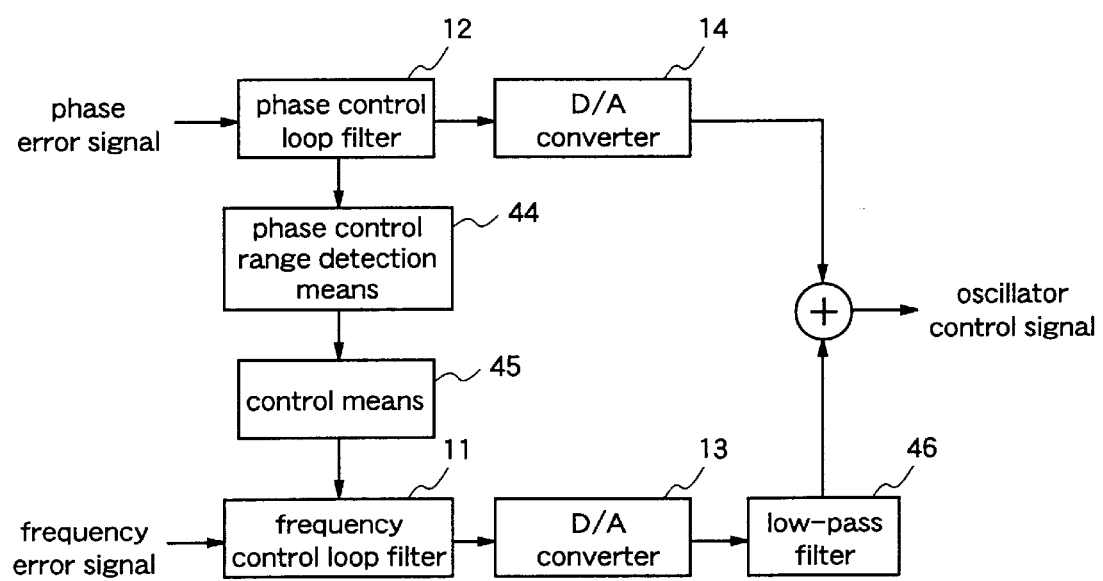
FIG. 10 is a block diagram illustrating a structure in which a frequency control loop filter 11 and a phase control loop filter 12 in the second embodiment work together.
Figure 11:
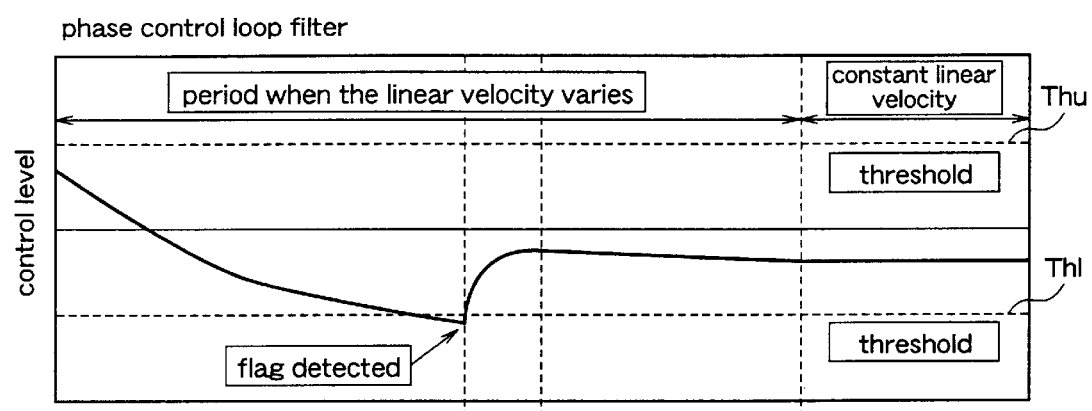
FIGS. 11(a) and 11(b) are diagrams showing the operations of control signals in the case where the frequency control loop filter 11 and the phase control loop filter 12 in the second embodiment work together.
Figure 11:
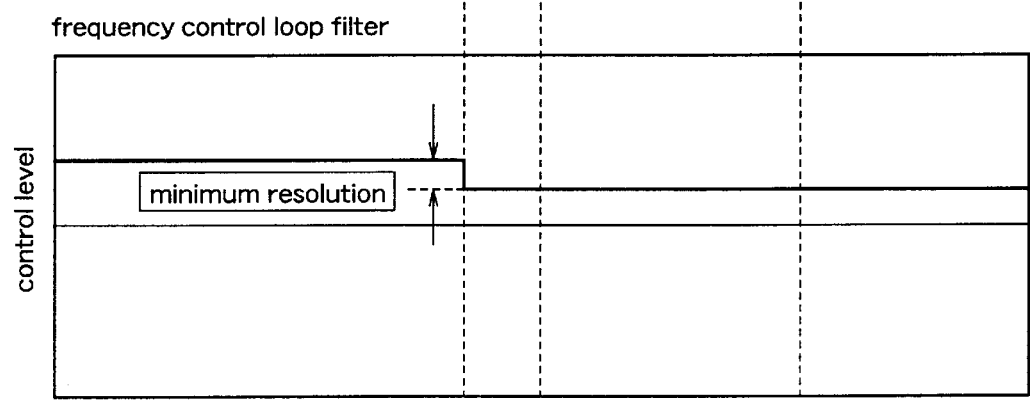
Figure 12:
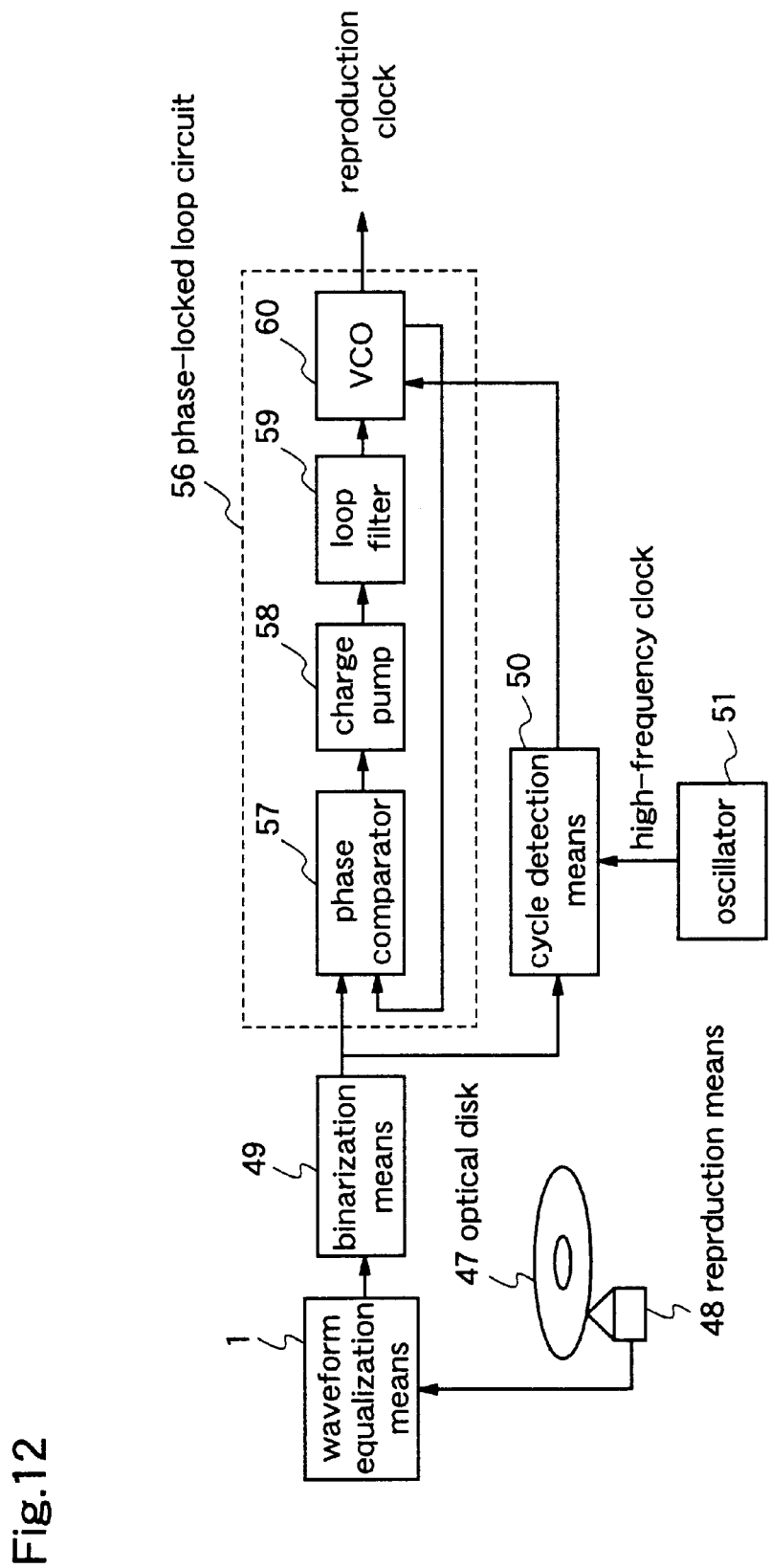
FIG. 12 is a block diagram illustrating a structure of a phase-locked loop circuit in a prior art optical disk reproduction device.
Figure 13:
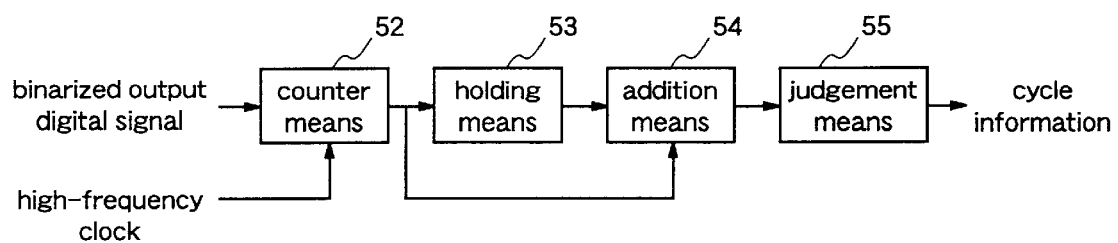
FIG. 13 is a block diagram illustrating a structure of a cycle detection means 50 in the prior art optical disk reproduction device.

In addition, the frequency control loop filter 11 and the phase control loop filter 12 work together as shown in FIG. 10. To be specific, a phase control range detection means 44 detects that the plural mode signals for deciding the control state, which are output by the mode control circuit 35, indicate that the reproduction clock is in phase with the reproduced digital signal and detects that the phase control loop filter 12 operates above or below a predetermined upper or lower limit threshold Thu or Thl for deciding the control range as shown in FIG. 11(*a*), and outputs a flag. A control means 45 controls the frequency control loop filter 11 so that the operation of the phase control loop filter 12 comes within the predetermined range, when the flag output by the phase control range detection means 44 is detected. For example, a low-pass filter 46 can be inserted at the output of the D/A converter 13, whereby the time constant is increased. Then, the frequency control loop filter 11 is controlled so as to operate in the same direction as the control direction of the phase control loop filter 12 by the minimum resolution of the D/A converter 13, i.e., the amount corresponding to the minimum resolution of the frequency, which can be controlled by the frequency control loop filter 11, as shown in FIG. 11(*b*). Thereby, the phase control loop filter 12 is controlled in the reverse direction with keeping the phase-locked state, and then returns within the predetermined thresholds. These functions enable to stably maintain the phase-locked state also in the case where the linear velocity of the reproduced data varies after the phase synchronization pull-in.

The frequency control and phase lock circuit according to the second embodiment uses the reproduction clock in place of the high-frequency clock, detects the cycle information and the phase information from the multi-bit reproduced digital data, which are obtained by the sampling using the reproduction clock, and performs the control so as to synchronize the phase of the reproduction clock with the phase of the clock component of the reproduced digital data, thereby unifying the clock into one system. Therefore, not only the structure of the circuit can be simplified but also the high-speed and stable phase synchronization pull-in can be realized using the reproduction clock also in a state where the linear velocity of the reproduced digital data varies.

In this second embodiment, as in the first embodiment, the reproduced digital data and the frequency error information are generated using the same clock. Therefore, also in the state where the linear velocity of the reproduced digital data varies, the stable phase synchronization pull-in can be realized.

Further, as in the first embodiment, the optimal one of the maximum pattern length and the minimum pattern length is selected and utilized as the frequency error. Therefore, not only the frequency pull-in can be performed at higher speed but also the frequency control can be performed also at the seeking time when the detection of the cycle is regarded as difficult.

Further, in this second embodiment, the frequency error detector comprises the synchronization pattern position detection means for detecting the position of the synchronization pattern using the sum of the adjacent zero cross lengths, which are detected by the zero cross length detector, the decision result output by the synchronization pattern judgement unit and the maximum pattern length held by the register, and the frequency error detector for detecting the interval between the synchronization patterns based on the detection result, converting the value of the interval into the frequency error information, and outputting the frequency error information, and has a function of switching the synchronization pattern position detection means based on the deviation between the frequency of the reproduction clock of the synchronization pattern and the frequency of the clock component of the reproduced digital data detected by the frequency error detector. Therefore, the position of the synchronization pattern can be detected according to the amount of deviation between the frequency of the reproduction clock and the frequency of the clock component of the digital data to be reproduced. Thus, the synchronization pattern position can be detected according to the deviation between the frequency of the reproduction clock and the frequency of the clock component of the reproduced digital data. Accordingly, not only the precision in the detection of the interval between the synchronization patterns is improved but also the resolution of the frequency information is increased compared with the case where the pattern length is detected. Therefore, the cycle can be detected with high precision, whereby the frequency pull-in of the reproduction clock can be performed stably as far as an area where the reproduction clock can be in phase with the reproduced digital data.

Further, in this second embodiment, the frequency error detector has a counter for counting a period during which no synchronization pattern is detected, using the reproduction clock. When the count value of the counter is larger than the predetermined value, the frequency error detector sets again the plural mode signals, which are output by the mode control circuit for deciding the control state of the frequency control and phase lock circuit, to a specific state. Therefore, the abnormal state is judged by calculating the period during which no synchronization pattern is detected, and when the state is judged as abnormal, the self-restoration operation is performed, whereby the restoration time in the abnormal operation can be reduced.

Further, in this second embodiment, the frequency error converter is provided for converting the frequency error information obtained from the interval between the synchronization patterns, which information is output by the frequency error detector, into the phase error information, and outputting the phase error information. The phase control circuit is operated based on the output phase error information and the reproduction clock is pulled into a frequency area where the phases can be synchronized, with high precision. Therefore, the phase control circuit is operated based on the frequency information detected by the frequency control circuit, and the frequency of the reproduction clock can be brought closer to the frequency of the clock component of the reproduced digital data, by the resolution of the frequency which can be controlled by the frequency control circuit or more. Accordingly, even when the capture range as the phase synchronization pull-in range of the phase-locked loop is narrow, the stable phase synchronization pull-in can be performed.

Further, in this second embodiment, the frequency control and phase lock circuit has both of the functions of the frequency error detector in the first embodiment and the frequency error detector, which is newly provided in the second embodiment. It controls the frequency of the reproduction clock based on the length of the specific pattern such as the synchronization pattern and the minimum inversion pattern in an area where the deviation between the frequency of the reproduction clock and the frequency of the clock component of the reproduced digital data is larger, controls the frequency of the reproduction clock on the basis of the interval between the synchronization patterns in an area where the deviation is smaller, obtains the deviation in the frequency between the reproduction clock and the clock component of the reproduced digital data, and uses the plural mode signals, which are output by the mode control circuit, for deciding the control state of the frequency control and phase lock circuit, to switch the control state continuously and automatically, thereby pulling in the frequency of the reproduction clock. Therefore, in the area where the deviation between the frequency of the reproduction clock and the frequency of the clock component of the reproduced digital signal is larger, the pattern length of the specific pattern can be detected more easily than the interval between the synchronization patterns. In the area where the deviation in the frequency is smaller, the interval between the synchronization patterns can be detected with higher precision. Accordingly, the frequency pull-in and the phase synchronization pull-in can be performed at high speed and with good stability by the control making the most of the respective advantages.

Further, in this second embodiment, the phase control range detection means detects that the plural mode signals for deciding the control state, which are output by the mode control circuit, show that the reproduction clock is in phase with the reproduced digital signal and that the phase control circuit operates outside the control range of the predetermined values, and outputs a flag. In addition, the means is provided for controlling the frequency control circuit so that the operation of the phase control circuit comes within the predetermined range when the flag output by the phase control range detection means is detected. Therefore, also when the linear velocity of the reproduced data varies after the phase synchronization pull-in, the phase-locked state can be stably maintained.

Industrial Availability

The frequency control and phase lock circuit according to the present invention is constructed so as to use the reproduction clock in place of the high-frequency clock, detect the frequency information and phase information from the multi-bit reproduced digital data, which are obtained by the sampling using the reproduction clock, and perform the control so as to synchronize the phase of the reproduction clock with the phase of the clock component of the reproduced digital data. Accordingly, the clock can be unified into one system, whereby the high-speed and stable phase synchronization pull-in can be performed using the reproduction clock, also in a state where the linear velocity of the reproduced digital data varies. Therefore, the frequency control and phase lock circuit which can perform the phase synchronization pull-in at high speed and with good stability can be provided.

What is claimed is:
1. A frequency control and phase lock circuit comprising:
waveform equalization means for emphasizing a predetermined frequency band of a reproduced signal;
an A/D converter for sampling an equalized signal to obtain a sampled multi-bit digital data signal using a reproduction clock to be used when the equalized signal is reproduced as digital data;
low-band noise suppression means for suppressing low-band noises in the signal obtained by the sampling;
a zero cross length detector for detecting a position where the signal crosses a zero level, the low-band noises of which signal are suppressed, counting a number of samples between adjacent zero crosses, and holding the number of samples in a register;
a frame counter for counting a specific period of at least one frame;
a maximum pattern length detector and a minimum pattern length detector for detecting a maximum value and a minimum value of count values of zero cross lengths in the counted specific period or sums of count values of adjacent zero cross lengths, respectively;
a cycle information judgement unit for comparing the maximum pattern length with the minimum pattern length, and selecting an optimal value of the pattern length as cycle information using a ratio between the maximum and minimum pattern lengths;
a frequency error detector for converting a difference between the cycle information which is selected by said cycle information judgement unit, and the maximum or minimum pattern length, which is to be detected at a phase-locked time, into a frequency error, and outputting the frequency error;
a frequency control circuit for performing control as far as an area where the reproduction clock can be synchronized with the reproduced digital signal based on an output of said frequency error detector;
a phase error detector for detecting phase information from the signal, the low-band noises of which signal are suppressed;
a phase control circuit for performing phase control so that the reproduction clock is in phase with the reproduced digital signal based on an output of said phase error detector; and
an oscillator for adding an output of said frequency control circuit and an output of said phase control circuit, and oscillating a reproduction clock based on the sum,
wherein said frequency control and phase lock circuit enables phase synchronization pull-in at a time of reproduction of the digital data.
2. The frequency control and phase lock circuit of claim 1,
wherein said maximum pattern length detector has a synchronization pattern judgement unit for judging whether or not a pattern is a synchronization pattern based on a ratio between adjacent zero cross lengths, and updates the maximum pattern length only when said judgement unit judges that the pattern is the synchronization pattern and has a value larger than a held value, and
wherein said minimum pattern length detector has a minimum inversion pattern judgement unit for judging whether or not a pattern is a minimum inversion pattern based on a ratio between the adjacent zero cross lengths, and updates the minimum pattern length only when said judgement unit judges that the pattern is the minimum inversion pattern and has a value smaller than a held value.

3. The frequency control and phase lock circuit of claim 2, wherein said cycle information judgement unit comprises:

registers for holding the maximum pattern length and the minimum pattern length, which are obtained within the specific period counted by said frame counter, at a termination of the period, respectively; and means for automatically setting a period, which is to be counted next by the frame counter, based on the pattern length which is obtained as a result of the comparison by the cycle information judgement unit between the values which are held respectively by the registers, the obtained pattern length being regarded as optimal as the cycle information.

4. The frequency control and phase lock circuit of claim 3, wherein said frequency error detector comprises:

synchronization pattern position detection means for detecting a position of a synchronization pattern using the sum of the adjacent zero cross lengths detected by the zero cross length detector, the judgement result output by the synchronization pattern judgement unit, and the maximum pattern length held by the register; and means for detecting an interval between the synchronization patterns based on a result of the detection, converting the value of the interval into frequency error information, and outputting the frequency error information, and said frequency control and phase lock circuit having a function of switching the precision in detecting the synchronization pattern position by the synchronization pattern position detection means according to deviation between a frequency of the reproduction clock of the synchronization pattern and a frequency of a clock component of the reproduced digital data detected by said frequency error detector.

5. The frequency control and phase lock circuit of claim 4, wherein said frequency error detector has a counter for counting a period during which no synchronization pattern is detected, based on the reproduction clock, and wherein when a count value of said counter is larger than a predetermined value, a mode control circuit for deciding a control state of the frequency control and phase lock circuit sets again plural mode signals output by said mode control circuit in a specific state.

6. The frequency control and phase lock circuit of claim 5, further comprising:

a frequency error converter for converting the frequency error information output by said frequency error detector, which information is obtained by converting the interval between the synchronization patterns, into phase error information, and outputting the phase error information, wherein said phase control circuit is operated based on the output phase error information, and the reproduction clock is pulled-in with high precision as far as a frequency area where the phase locking can be performed.

7. The frequency control and phase lock circuit of claim 4, wherein the frequency of the reproduction clock is controlled based on the pattern length of the specific pattern in an area where the deviation between the frequency of the reproduction clock and the frequency of the clock component of the reproduced digital data is larger, and the frequency of the reproduction clock is controlled based on the interval between the synchronization patterns in an area where the deviation is smaller, and wherein the control state is switched continuously and automatically in accordance with one of the plural mode signals, which are output by a mode control circuit for deciding the control state of the frequency control and phase lock circuit, according to the deviation in the frequency between the reproduction clock and the clock component of the reproduced digital data, thereby pulling-in the frequency of the reproduction clock.

8. The frequency control and phase lock circuit of claim 7, further comprising:

phase control range detection means for detecting that one of the plural mode signals for deciding the control state, which are output by the mode control circuit, indicates that the reproduction clock is in phase with the reproduced digital signal and said phase control circuit operates outside a control range of predetermined values, and outputting a flag, wherein the operation of said frequency control circuit is controlled so that the operation of the phase control circuit comes within the predetermined range, when the flag output by said phase control range detection means is detected.

9. A frequency control and phase lock circuit comprising:

a waveform equalization device operable to emphasize a predetermined frequency band of a reproduced signal;

an A/D converter operable to sample an equalized signal to obtain a sampled multi-bit digital data signal using a reproduction clock to be used when the equalized signal is reproduced as digital data;

a low-band noise suppression device operable to suppress low-band noises in the signal obtained by the sampling;

a zero cross length detector operable to detect a position where the signal crosses a zero level, the low-band noises of which signal are suppressed, to count a number of samples between adjacent zero crosses, and to hold the number of samples in a register;

a frame counter operable to count a specific period of at least one frame;

a maximum pattern length detector and a minimum pattern length detector operable to detect a maximum value and a minimum value of count values of zero cross lengths in the counted specific period or sums of count values of adjacent zero cross lengths, respectively;

a cycle information judgement unit operable to compare the maximum pattern length with the minimum pattern length, and to select an optimal value of the pattern length as cycle information using a ratio between the maximum and minimum pattern lengths;

a frequency error detector operable to convert a difference between the cycle information which is selected by said cycle information judgement unit, and the maximum or minimum pattern length, which is to be detected at a phase-locked time, into a frequency error, and to output the frequency error;

a frequency control circuit operable to perform control as far as an area where the reproduction clock can be synchronized with the reproduced digital signal based on an output of said frequency error detector;

a phase error detector operable to detect phase information from the signal, the low-band noises of which signal are suppressed;

a phase control circuit operable to perform phase control so that the reproduction clock is in phase with the reproduced digital signal based on an output of said phase error detector; and an oscillator operable to add an output of said frequency control circuit and an output of said phase control circuit, and to oscillate a reproduction clock based on the sum, wherein said frequency control and phase lock circuit enables phase synchronization pull-in at a time of reproduction of the digital data.

10. The frequency control and phase lock circuit of claim 9, wherein said maximum pattern length detector has a synchronization pattern judgement unit is operable to judge whether a pattern is a synchronization pattern based on a ratio between adjacent zero cross lengths, and to update the maximum pattern length only when said judgement unit judges that the pattern is the synchronization pattern and has a value larger than a held value, and wherein said minimum pattern length detector has a minimum inversion pattern judgement unit operable to judge whether a pattern is a minimum inversion pattern based on a ratio between the adjacent zero cross lengths, and to update the minimum pattern length only when said judgement unit judges that the pattern is the minimum inversion pattern and has a value smaller than a held value.

11. The frequency control and phase lock circuit of claim 10, wherein said cycle information judgement unit comprises:

registers operable to hold the maximum pattern length and the minimum pattern length, which are obtained within the specific period counted by said frame counter, at a termination of the period, respectively; and a setting device operable to automatically set a period, which is to be counted next by the frame counter, based on the pattern length which is obtained as a result of the comparison by the cycle information judgement unit between the values which are held respectively by the registers, the obtained pattern length being regarded as optimal as the cycle information.

12. The frequency control and phase lock circuit of claim 11, wherein said frequency error detector comprises synchronization pattern position detector and an interval detector, wherein said synchronization pattern position detector is operable to detect a position of a synchronization pattern using the sum of the adjacent zero cross lengths detected by the zero cross length detector, the judgement result output by the synchronization pattern judgement unit, and the maximum pattern length held by the register, wherein said interval detector is operable to detect an interval between the synchronization patterns based on a result of the detection, to convert the value of the interval into frequency error information, and to output the frequency error information, and wherein said frequency control and phase lock circuit have a function of switching the precision in detecting the synchronization pattern position by the synchronization pattern position detector according to deviation between a frequency of the reproduction clock of the synchronization pattern and a frequency of a clock component of the reproduced digital data detected by said frequency error detector.

13. The frequency control and phase lock circuit of claim 12, further comprising:

a mode control circuit, operable to decide a control state of said frequency control and phase lock circuit, wherein said frequency error detector has a counter operable to count a period during which no synchronization pattern is detected, based on the reproduction clock, and wherein when a count value of said counter is larger than a predetermined value, said mode control circuit sets again plural mode signals output by said mode control circuit in a specific state.

14. The frequency control and phase lock circuit of claim 13, further comprising:

a frequency error converter operable to convert the frequency error information output by said frequency error detector, which information is obtained by converting the interval between the synchronization patterns, into phase error information, and to output the phase error information, wherein said phase control circuit is operated based on the output phase error information, and the reproduction clock is pulled-in with high precision as far as a frequency area where the phase locking can be performed.

15. The frequency control and phase lock circuit of claim 12, further comprising:

a mode control circuit, operable to decide a control state of said frequency control and phase lock circuit, wherein the frequency of the reproduction clock is controlled based on the pattern length of the specific pattern in an area where the deviation between the frequency of the reproduction clock and the frequency of the clock component of the reproduced digital data is larger, and the frequency of the reproduction clock is controlled based on the interval between the synchronization patterns in an area where the deviation is smaller, and wherein the control state is switched continuously and automatically in accordance with one of the plural mode signals which are output by said mode control circuit according to the deviation in the frequency between the reproduction clock and the clock component of the reproduced digital data, thereby pulling-in the frequency of the reproduction clock.

16. The frequency control and phase lock circuit of claim 15, further comprising:

a phase control range detector operable to detect that one of the plural mode signals for deciding the control state, which are output by said mode control circuit, indicates that the reproduction clock is in phase with the reproduced digital signal and said phase control circuit operates outside a control range of predetermined values, and to output a flag, wherein the operation of said frequency control circuit is controlled so that the operation of said phase control circuit comes within the predetermined range, when the flag output by said phase control range detector is detected.

* * * * *